(12) United States Patent
Chou et al.

(10) Patent No.: US 12,701,982 B2
(45) Date of Patent: Aug. 4, 2026

(54) SEMICONDUCTOR STRUCTURE AND MANUFACTURING METHOD THEREOF

(71) Applicant: Taiwan Semiconductor Manufacturing Company, Ltd., Hsinchu (TW)

(72) Inventors: Chuan-Pu Chou, Hsinchu (TW); Chia-Tien Wu, Hsinchu (TW); Hsin-Ping Chen, Hsinchu (TW); Wei-Chen Chu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 371 days.

(21) Appl. No.: 18/385,134

(22) Filed: Oct. 30, 2023

(65) Prior Publication Data

US 2025/0140683 A1 May 1, 2025

(51) Int. Cl.
| | |
|---|---|
| *H10W 20/42* | (2026.01) |
| *H10W 20/00* | (2026.01) |
| *H10W 20/46* | (2026.01) |
| *H10W 20/48* | (2026.01) |

(52) U.S. Cl.
CPC ......... *H10W 20/42* (2026.01); *H10W 20/069* (2026.01); *H10W 20/072* (2026.01); *H10W 20/46* (2026.01); *H10W 20/48* (2026.01)

(58) Field of Classification Search
CPC . H10W 20/42; H10W 20/069; H10W 20/072; H10W 20/46; H10W 20/48
See application file for complete search history.

(56) References Cited

U.S. PATENT DOCUMENTS

2021/0305090 A1* 9/2021 Cheng ................. H10W 20/075

* cited by examiner

*Primary Examiner* — Samuel A Gebremariam
(74) *Attorney, Agent, or Firm* — Birch, Stewart, Kolasch & Birch, LLP

(57) ABSTRACT

A semiconductor structure is provided. The semiconductor structure includes a first dielectric layer, a first metal layer, a via, an air gap, an etching stop layer, a second dielectric layer, and a second metal layer. The first metal layer is embedded in the first dielectric layer. The first metal layer includes a first conductive line and a second conductive line. The via is disposed on the first conductive line. The air gap is located on the second conductive line. The sustaining layer covers the air gap. The etching stop layer is disposed on the sustaining layer. The second dielectric layer is disposed on the etching stop layer. The second metal layer is disposed on the second dielectric layer and connected to the via.

20 Claims, 21 Drawing Sheets

100

SEMICONDUCTOR STRUCTURE AND MANUFACTURING METHOD THEREOF

BACKGROUND

The disclosure relates in general to a semiconductor structure and a manufacturing method thereof, and more particularly to a semiconductor structure for connecting two metal layers and a manufacturing method thereof.

Resistance-capacitance (RC) delay was significantly impact device performance as dimension shrinkage. In traditional damascene structure, higher-k etch-stop-layer and low-k dielectric damage resulted in a poor capacitance performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
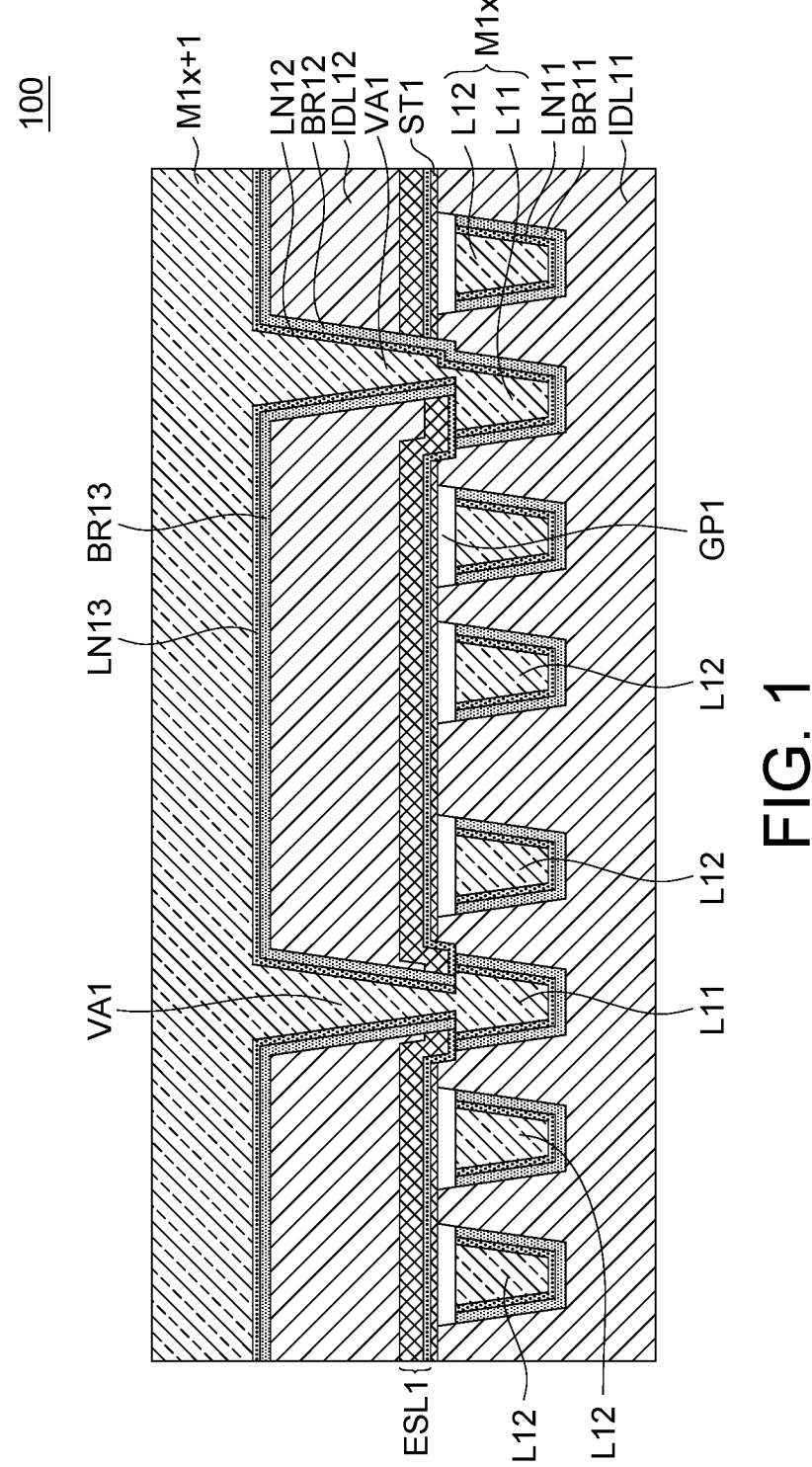
FIG. 1 shows a semiconductor structure 100 according to one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit manufacturing process flow is typically divided into three categories: front-end-of-line (FEOL) process, middle-end-of-line (MEOL) process, and back-end-of-line (BEOL) process. The FEOL process generally encompasses processes related to fabricating IC devices, such as transistors. For example, the FEOL processes may include forming isolation, gate structures, and source and drain (generally referred to as source/drain). The MEOL process generally encompasses processes related to fabricating contacts to conductive components (or conductive regions) of the IC devices, such as contacts to the gate structures and/or the source/drain. Contacts fabricated during MEOL may be referred to as device-level contacts, metal contacts, and/or local interconnects. The BEOL process generally encompasses processes related to fabricating a multilayer interconnect (MLI) structure that interconnects IC features fabricated by the FEOL process and the MEOL process, thereby enabling operation of the IC devices. Often, each layer in the MLI structure (also referred to as an interconnect layer or interconnect level) includes at least one conductive component disposed in an insulator layer, such as a metal line and a via disposed in a dielectric layer, where the via connects the metal line to a conductive feature in a different interconnect layer.

Resistance-capacitance (RC) delay significantly impacts the device performance as dimension shrinkage. In traditional damascene structure, the etching stop layer with high-k and the dielectric layer with low-k resulted in a poor capacitance performance.

The present disclosure provides a new structure with air-gap for capacitance reduction and performance boost. The via in this structure could be self-aligned and could provide time dependent dielectric breakdown (TDDB) improvement. Furthermore, the process can be easily integrated with known process flow. The present disclosure can be implanted to FEOL, MEOL and BEOL for high performance application.

Please refer to FIG. 1, which shows a semiconductor structure 100 according to one embodiment. The semiconductor structure 100 includes a first dielectric layer IDL11, a first metal layer M1$x$, a first barrier layer BR11, a first liner layer LN11, at least one via VA1, a second barrier layer BR12, a second liner layer LN12, at least one air gap GP1, a sustaining layer ST1, an etching stop layer ESL1, a second dielectric layer IDL12, a second metal layer M1$x$+1, a third barrier layer BR13 and a third liner layer LN13.

The material of the first dielectric layer IDL11 is a low-k material with a k-value less than about 4.0. The material of the first dielectric layer IDL11 is, for example, silicon oxide (SiOx), silicon oxycarbide (SiCO), silicon carbon nitride (SiCN), silicon oxycarbonitride (SiCON), silicon oxynitride (SiNO), silicon nitride (SiNx), carbon-doped hydrogenated silicon oxide (SiOCH), oxygen doped carbide (ODC), nitrogen doped silicon carbide (NDC), tetraethylorthosilicate (TEOS), the like or a combination thereof.

The first metal layer M1$x$ is embedded in the first dielectric layer IDL11. The first metal layer M1$x$ includes a first conductive line L11 and a second conductive line L12. The material of the first metal layer M1$x$ is, for example, copper (Cu), ruthenium (Ru), tungsten (W), titanium (Ti), aluminum (Al), cobalt (Co), molybdenum (Mo), iridium (Ir), rhodium (Rh), graphene, nickel (Ni), gold (Au), silver (Ag), gold-aluminum (AuAl), the like, or a combination thereof. The material of the first conductive line L11 and the material of the second conductive line L12 could be identical or different.

The aspect ratio (A/R) of the first conductive line L11 is, for example, 1 to 4. The aspect ratio (A/R) of the second conductive line L12 is, for example, 1 to 4. The aspect ratio (A/R) of the first conductive line L11 and the aspect ratio (A/R) of the second conductive line L12 could be identical or different.

The first barrier layer BRI1 and the first liner layer LN11 are disposed between the first metal layer M1$x$ and the first dielectric layer IDL11. The material of the first barrier layer BR11 is, for example, titanium nitride (TiN), tantalum nitride (TaN) or silicon nitride (SiN), the like, or a combination thereof. The material of the first liner layer LN11 is, for example, cobalt (Co), titanium, titanium nitride, tantalum, tantalum nitride, or the like.

The via VA1 is disposed on and connected to the first conductive line L11. The material of the via VA1 is, for example, copper (Cu), ruthenium (Ru), tungsten (W), titanium (Ti), aluminum (Al), cobalt (Co), molybdenum (Mo), iridium (Ir), rhodium (Rh), graphene, nickel (Ni), gold (Au), silver (Ag), gold-aluminum (AuAl), the like, or a combination thereof. The material of the via VA and the material of the first metal layer M1$x$ could be identical or different. The height of the via VA1 is, for example, 100 to 1000 Å.

The second barrier layer BR12 and the second liner layer LN12 are disposed between the via VA1 and the second dielectric layer IDL12. The material of the second barrier layer BR12 is, for example, titanium nitride (TiN), tantalum nitride (TaN) or silicon nitride (SiN), the like, or a combination thereof. The material of the second liner layer LN12 is, for example, cobalt (Co), titanium, titanium nitride, tantalum, tantalum nitride or the like.

The air gap GP1 is located on the second conductive line L12. The air gap GP1 filled with air without any metal material or dielectric material. The height of the air gap GP1 is, for example, 50 to 200 Å.

The sustaining layer ST1 covers the air gap GP1. The sustaining layer ST1 is used to sustain the space of the air gap GP1. The material of the sustaining layer ST1 is, for example, silicon carbon nitride (SiCxNy), boron nitride (BN), boron carbonitride (BCN), silicon oxycarbonitride (SiOCN), silicon oxycarbide (SiOC), the like, or a combination thereof. The thickness of the sustaining layer ST1 is, for example, 10 to 50 Å.

The etching stop layer ESL1 is disposed on the sustaining layer ST1. The etching stop layer ESL1 is a single layer structure or a multi-layer structure. The material of the etching stop layer ESL1 is, for example, silicon carbon nitride (SiCxNy), silicon oxycarbide (SixOyCz), silicon oxide (SiOx), silicon nitride (SiNx), aluminum oxynitride (AlOxNy), metal oxide (e.g. oxygen doped carbide (ODC), nitrogen doped silicon carbide (NDC), tetraethylorthosilicate (TEOS), aluminum oxide (AlOx)), boron nitride (BN), boron carbonitride (BCN), silicon oxycarbonitride (SiOCN), the like, or a combination thereof. The thickness of the etching stop layer ESL1 is, for example, 0 to 300 Å.

The second dielectric layer IDL12 is disposed on the etching stop layer ESL1. The material of the second dielectric layer IDL12 is a low-k material with a k-value less than about 4.0. The material of the second dielectric layer IDL12 is, for example, silicon oxide (SiOx), silicon oxycarbide (SiCO), silicon carbon nitride (SiCN), silicon oxycarbonitride (SiCON), silicon oxynitride (SiNO), silicon nitride (SiNx), carbon-doped hydrogenated silicon oxide (SiOCH), oxygen doped carbide (ODC), nitrogen doped silicon carbide (NDC), tetraethylorthosilicate (TEOS), the like or a combination thereof. The material of the second dielectric layer IDL12 and the material of the first dielectric layer IDL11 is identical or different. The thickness of the second dielectric layer IDL12 is, for example, 100 to 1000 Å.

The second metal layer M1$x$+1 is disposed on the second dielectric layer IDL12 and connected to the via VAL. The material of the second metal layer M1$x$+1 is, for example, copper (Cu), ruthenium (Ru), tungsten (W), titanium (Ti), aluminum (Al), cobalt (Co), molybdenum (Mo), iridium (Ir), rhodium (Rh), graphene, nickel (Ni), gold (Au), silver (Ag), gold-aluminum (AuAl), the like, or a combination thereof. The material of the via VA1 and the material of the second metal layer M1$x$+1 could be identical or different. The aspect ratio (A/R) of the second metal layer M1$x$+1 is, for example, 1 to 4.

The third barrier layer BR13 and the third liner layer LN13 are disposed between the second metal layer M1$x$+1 and the second dielectric layer IDL12. The material of the third barrier layer BR13 is, for example, titanium nitride (TiN), tantalum nitride (TaN) or silicon nitride (SiN), the like, or a combination thereof. The material of the third liner layer LN13 is, for example, cobalt (Co), titanium, titanium nitride, tantalum, tantalum nitride or the like.

As shown in the FIG. 1, the sustaining layer ST1 covers the first dielectric layer IDL11 and is supported by the first dielectric layer IDL11, so that the space of the air gap GP1 could be sustained.

A top surface of the second conductive line L12 is fully covered by the air gap GP1. The top surface of the second conductive line L12 is fully exposed by air. In this embodiment, the air gap GP1 also covers the first barrier layer BR11 and the first liner layer LN11 disposed between the second conductive line L12 and the first dielectric layer IDL11. The air gap GP1 formed on the second conductive line L12 could improve the capacitance performance.

A top surface of the first dielectric layer IDL11 is higher than a top surface of the second conductive line L12 and a bottom of the via VA1 is lower than a top of the air gap GP1. As shown in the FIG. 1, even if the right via VA1 is shifted, this via VA1 could be self-aligned on the second conductive line L12 without connecting to the second conductive line L12.

Please refer to FIGS. 2A to 2K and FIGS. 3A to 3K. The FIGS. 2A to 2K illustrate a manufacturing method of the semiconductor structure 100 according to one embodiment. The FIGS. 3A to 3K respectively show top views of the FIGS. 2A to 2K. As shown in the FIGS. 2A and 3A, the first dielectric layer IDL11 is formed. The first dielectric layer IDL11 could be formed, for example, by spin coating, plasma enhanced chemical vapor deposition (PECVD), plasma enhanced atomic layer deposition (PEALD) or other suitable process.

Figures 2A, 2B, 3A, 3B:
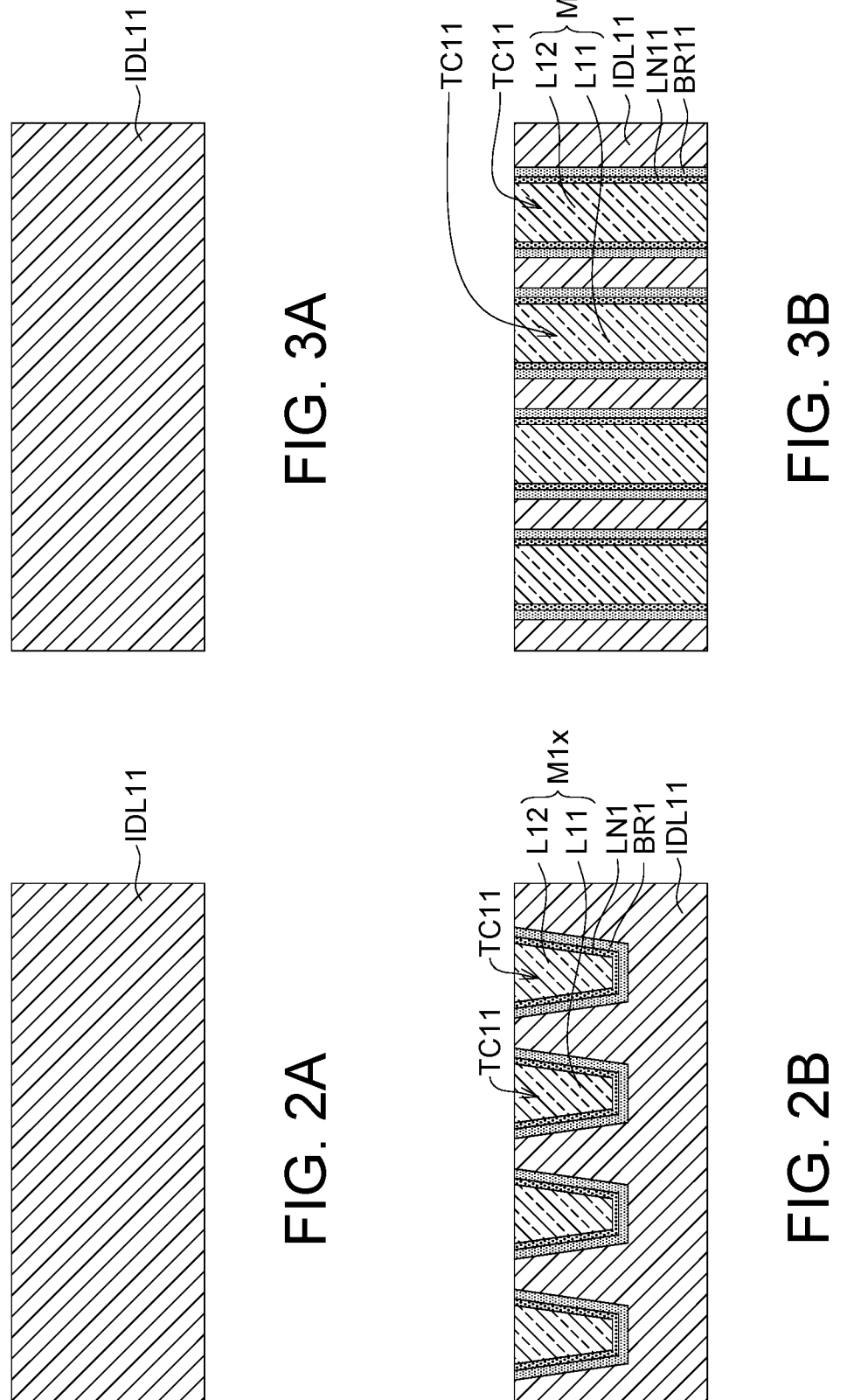
FIGS. 2A to 2K illustrate a manufacturing method of the semiconductor structure 100 according to one embodiment.
FIGS. 3A to 3K respectively show top views of the FIGS. 2A to 2K.

Afterwards, as shown in the FIGS. 2B and 3B, the first metal layer M1$x$ embodied in the first dielectric layer IDL11 is formed. In this step, trenches TC11 are formed in the first dielectric layer IDL11. Next, the first barrier layer BR11 is formed in the trenches TC11 and on the first dielectric layer IDL11. The first barrier layer BR11 could be formed, for example, by chemical vapor deposition (CVD), physical vapor deposition (PVD), plating or other suitable processes. Then, the first liner layer LN11 is formed on the first barrier layer BR11. The first liner layer LN11 is formed, for example, by atomic layer deposition (ALD), plasma enhanced atomic layer deposition (PEALD), vapor phase epitaxy (VPE), molecular beam epitaxy (MBE), or other suitable process. Next, the first metal layer M1x including the first conductive line L11 and the second conductive line L12 are filled in the trenches TC11 and formed on the first liner layer LN11. The first metal layer M1x could be formed, for example, by electro chemical plating (ECP), electroless deposition (ELD), chemical vapor deposition (CVD), physical vapor deposition (PVD), plating or other suitable processes. In this step, the first metal layer M1x could be patterned by single-damascene, dual-damascene or metal etch (RIE) process.

Figures 2C, 2D, 3C, 3D:
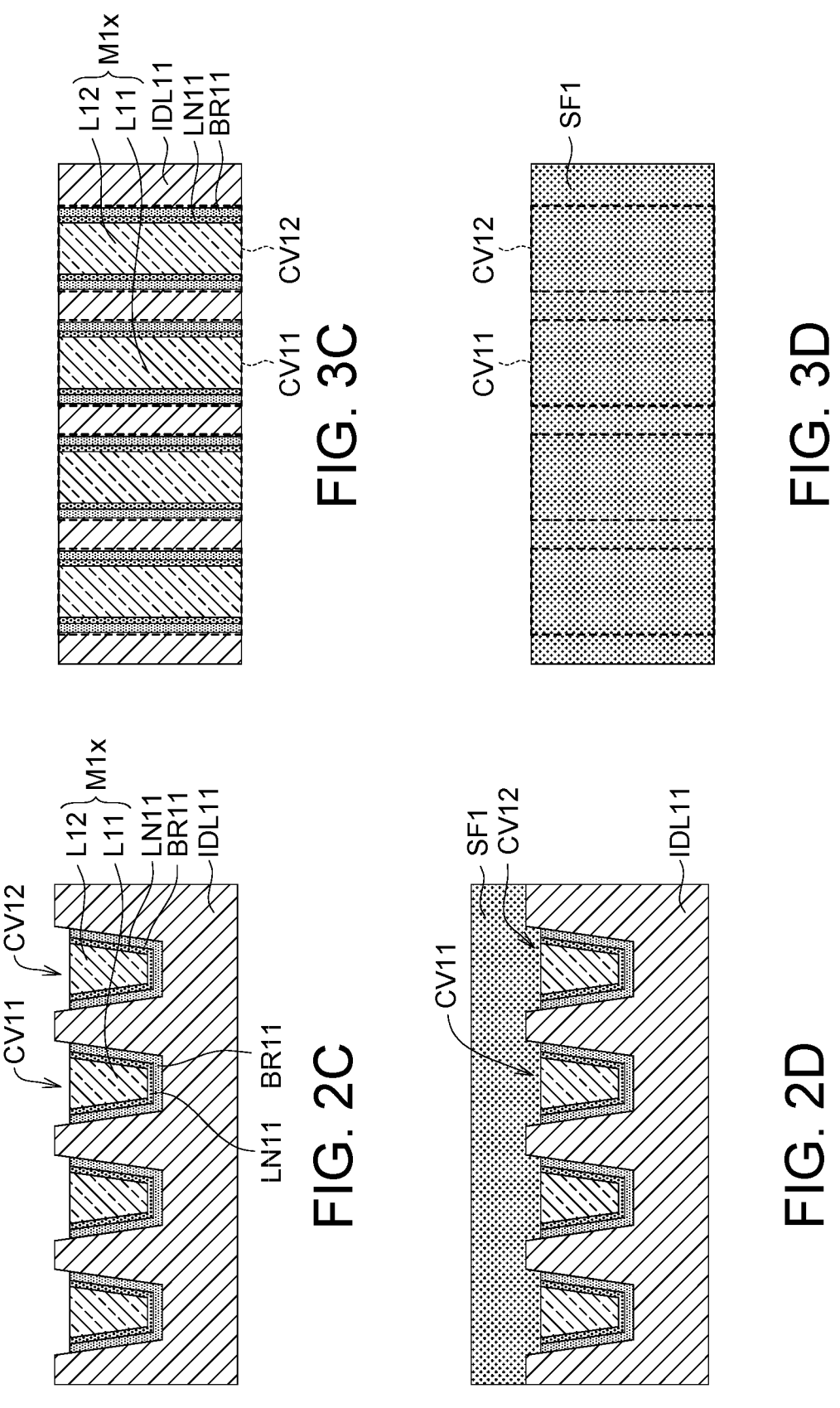

Then, as shown in the FIGS. 2C and 3C, a first concave CV11 and a second concave CV12 are formed on the first conductive line L11 and the second conductive line L12 respectively. The first conductive line L11 and the second conductive line L12 could be etched, for example, by chemical mechanical polish (CMP) metal dishing, wet etching, dry etching, forming dielectric material on the first dielectric layer IDL11 or other suitable process. In the embodiment shown in the FIGS. 2C and 3C, the first barrier layer BR11 and the first liner layer LN11 are etched. The lateral walls of the first concave CV11 and the second concave CV12 expose the first dielectric layer IDL11.

Next, as shown in the FIGS. 2D and 3D, a sacrificial material SF1 is formed in the first concave CV11 and the second concave CV12, and on the first dielectric layer IDL11. The sacrificial material SF1 is formed, for example, by spinning on, chemical vapor deposition (CVD), physical vapor deposition (PVD), atomic layer deposition (ALD), or other suitable process.

Figures 2E, 2F, 3E, 3F:
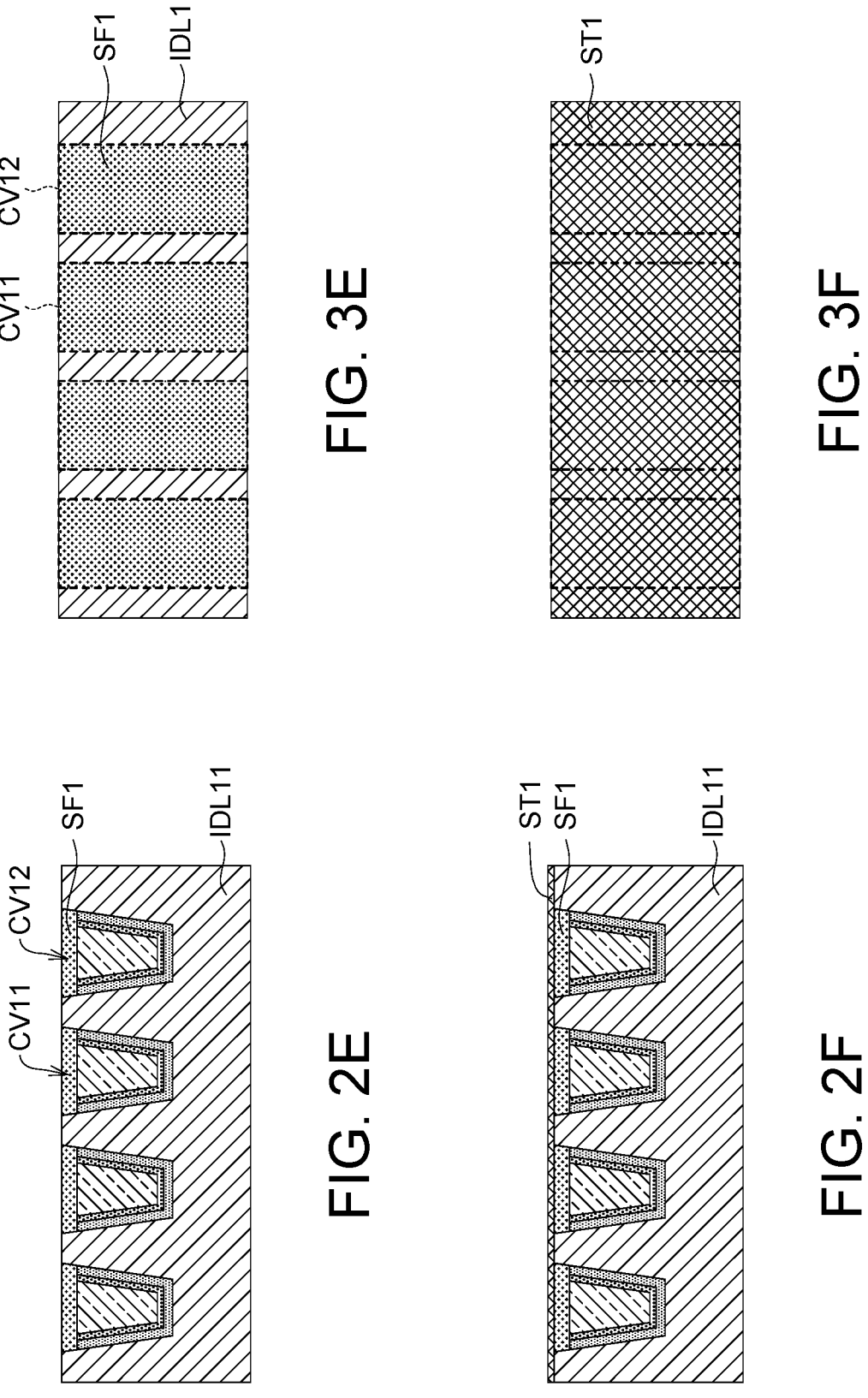

Afterwards, as shown in the FIGS. 2E and 3E, the sacrificial material SF1 is thinned down to expose the first dielectric layer IDL11. The sacrificial material SF1 is thinned down by chemical mechanical polish (CMP), dry etching, or other suitable process.

Then, as shown in the FIGS. 2F and 3F, the sustaining layer ST1 is formed on the sacrificial material SF1 and the first dielectric layer IDL11. The sustaining layer ST1 is formed, for example, by chemical vapor deposition (CVD), physical vapor deposition (PVD), atomic layer deposition (ALD), or other suitable process.

Figures 2G, 2H, 3G, 3H:
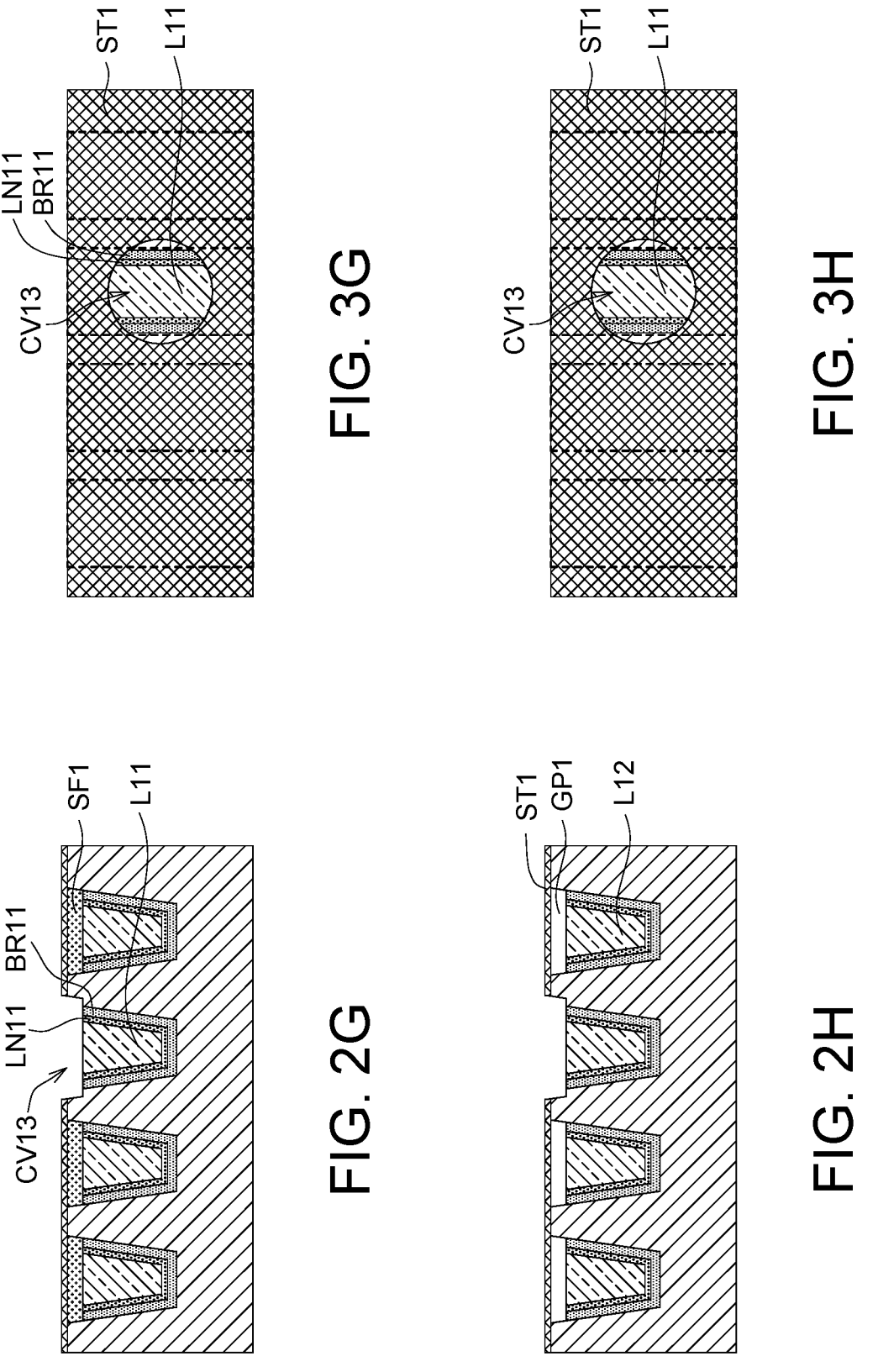

Next, as shown in the FIGS. 2G and 3G, a third concave CV13 is formed to expose the first conductive line L11. The third concave CV13 may also expose the first liner layer LN11 and the first barrier layer BR11. In this step, the third concave CV13 is formed, for example, by dry etching, wet etching, or other suitable process.

Then, as shown in the FIGS. 2H and 3H, the sacrificial material SF1 is removed to form the air gap GP1 disposed between the sustaining layer ST1 and the second conductive line L12. The sacrificial material SF1 is removed by a thermal process, such as UV, flash lamp or laser.

Figures 2I, 2J, 3I, 3J:
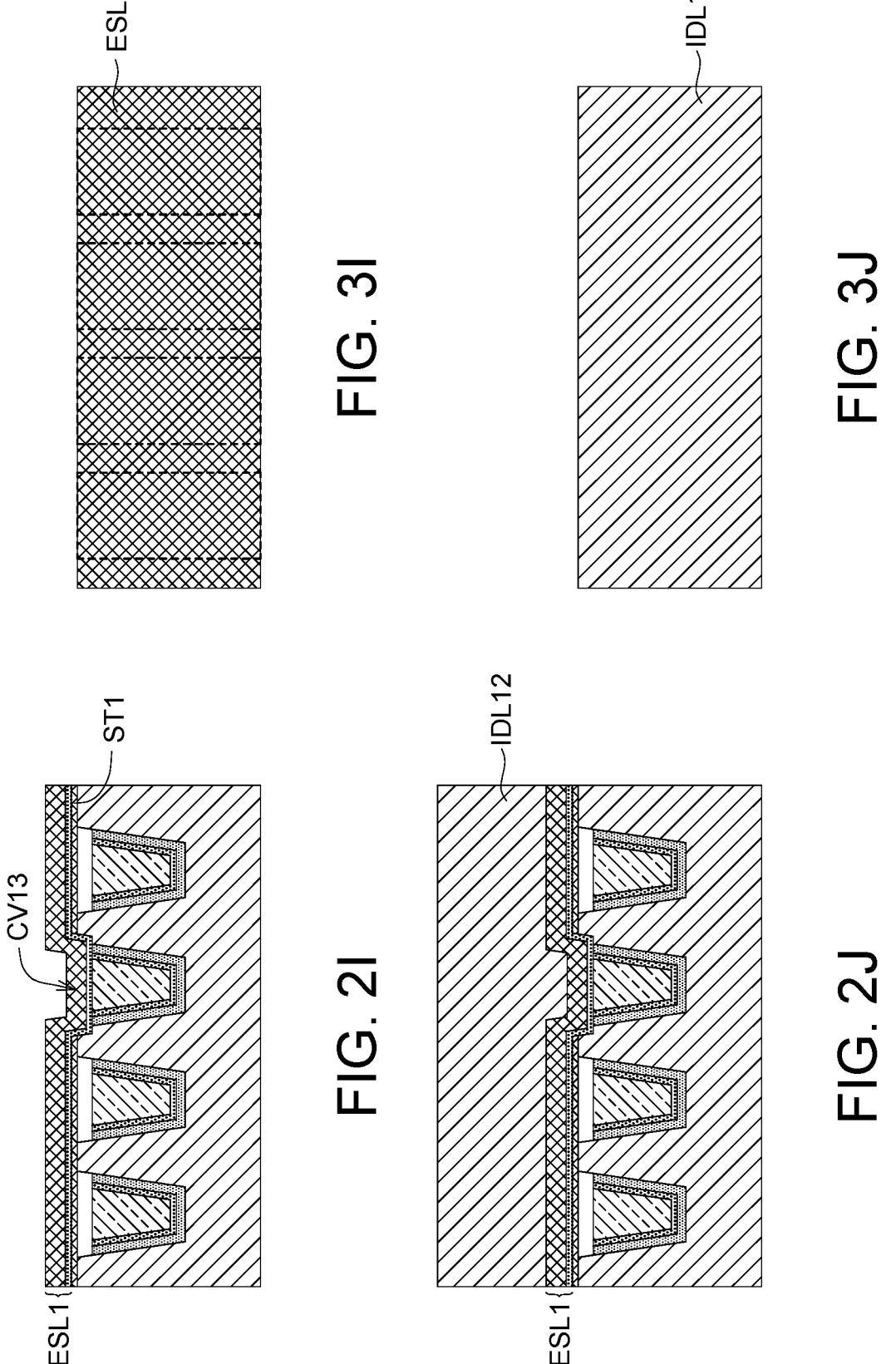

Next, as shown in the FIGS. 2I and 3I, the etching stop layer ESL1 is formed on the sustaining layer ST1 and in the third concave CV13. The etching stop layer ESL1 is formed, for example, by plasma enhanced chemical vapor deposition (PECVD), plasma enhanced atomic layer deposition (PEALD), spin coating, remote plasma chemical vapor deposition (CVD), remote plasma physical vapor deposition (PVD) or other suitable process.

Afterwards, as shown in the FIGS. 2J and 3J, the second dielectric layer IDL12 is formed on the etching stop layer ESL1. The second dielectric layer IDL12 could be formed, for example, by spin coating, plasma enhanced chemical vapor deposition (PECVD), plasma enhanced atomic layer deposition (PEALD) or other suitable process.

Figure 3K:
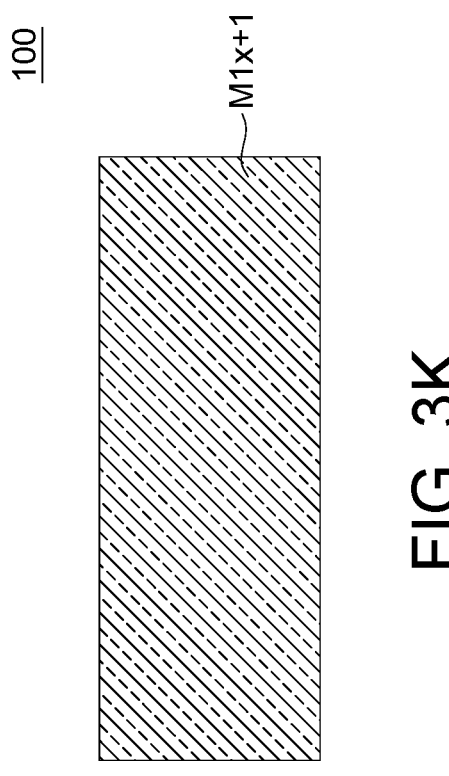
Figure 2K:
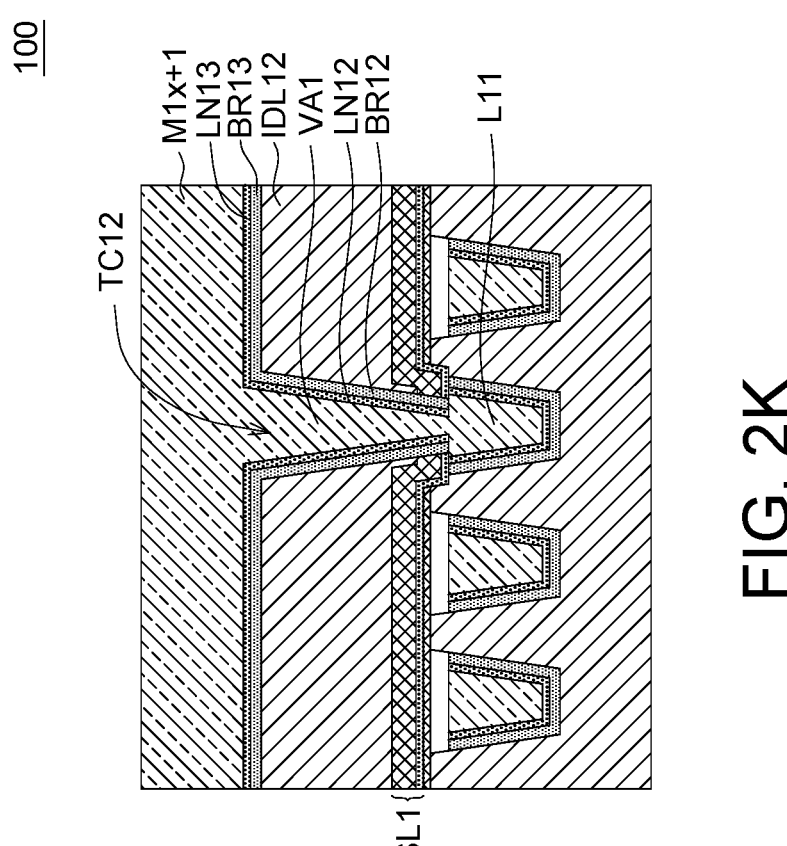

Next, as shown in the FIGS. 2K and 3K, the via VA1 and the second metal layer M1x+1 are formed. The via VA1 is embedded in the second dielectric layer IDL12 and connects the first conductive line L11, and the second metal layer M1x+1 is formed on the second dielectric layer IDL12 to connect the via VAL. The via VA1 and the second metal layer M1x+1 could be patterned by single-damascene process or dual-damascene process.

For example, in this step, a trench TC12 is formed in the second dielectric layer IDL12 to expose the first conductive line L11. Next, the second barrier layer BR12 and the third barrier layer BR13 are formed in the trench TC12 and on the second dielectric layer IDL12. The second barrier layer BR12 and the third barrier layer BR13 could be formed, for example, by chemical vapor deposition (CVD), physical vapor deposition (PVD), plating or other suitable processes. Then, the second liner layer LN12 and the third liner layer LN13 are formed on the second barrier layer BR12 and the third barrier layer BR13 respectively. The second liner layer LN12 and the third liner layer are formed, for example, by atomic layer deposition (ALD), plasma enhanced atomic layer deposition (PEALD), vapor phase epitaxy (VPE), molecular beam epitaxy (MBE), or other suitable process. Next, the via VA1 is formed in the trench TC12 and the second metal layer M1x+1 is formed on the third liner layer LN13. The via VA1 and the second metal layer M1x+1 could be formed, for example, by electro chemical plating (ECP), electroless deposition (ELD), chemical vapor deposition (CVD), physical vapor deposition (PVD), plating or other suitable processes. The patterning for the via VA1 could be performed by 1P1E (one-patterning-one-etching) process or 2P2E (two-patterning-two-etching) process. According to the FIGS. 2A to 2K and 3A to 3K, the semiconductor structure 100 is formed.

As shown in the FIG. 1, the via VA1 would be self-aligned on the first conductive line L11. Even if the via VA1 is shifted to the right, the via VA1 and the second conductive line L12 are separated at a sufficient distance, as such the time dependent dielectric breakdown (TDDB) window is improved. Moreover, the air gap GP1 provides a low-capacitance region for capacitance reduction and performance boost.

In addition to the above embodiment, another embodiment of the semiconductor structure may be adopted. Please refer to FIG. 4, which shows a semiconductor structure 200 according to another embodiment. In the FIG. 4, the air gaps GP2 are only formed on some of the second conductive lines L12. Some of the second conductive lines L12 are not covered by the air gaps GP2.

Please refer to FIGS. 5A to 5K and FIGS. 6A to 6K. The FIGS. 5A to 5K illustrate a manufacturing method of the semiconductor structure 200 according to one embodiment. The FIGS. 6A to 6K respectively show top views of the FIGS. 5A to 5K. As shown in the FIGS. 5A and 5A, the first dielectric layer IDL11 is formed.

Figures 5A, 5B, 6A, 6B:
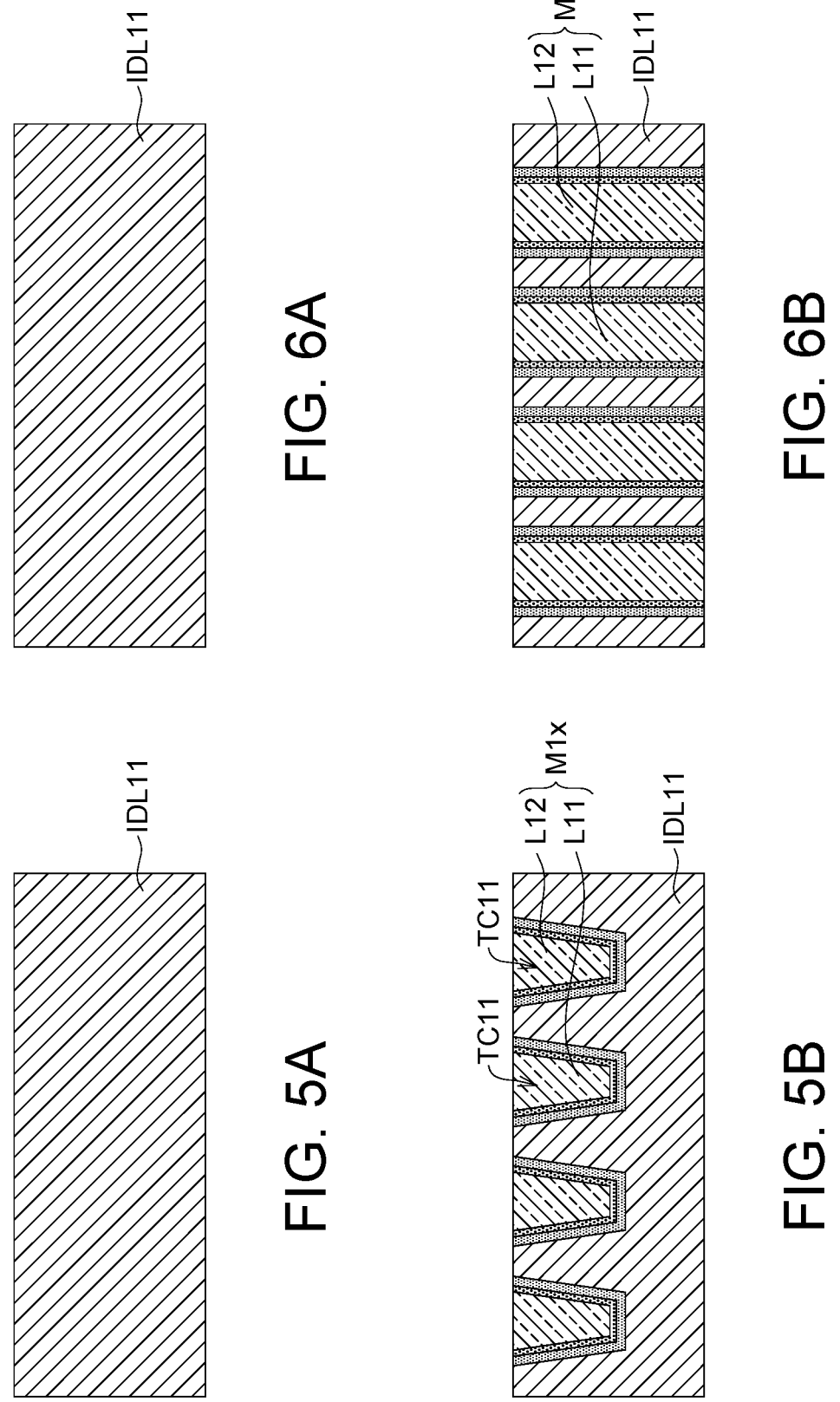
FIGS. 5A to 5K illustrate a manufacturing method of the semiconductor structure 200 according to one embodiment.
FIGS. 6A to 6K respectively show top views of the FIGS. 5A to 5K.

Afterwards, as shown in the FIGS. 5B and 6B, the first metal layer M1x embodied in the first dielectric layer IDL11 is formed.

Figures 5C, 5D, 6C, 6D:
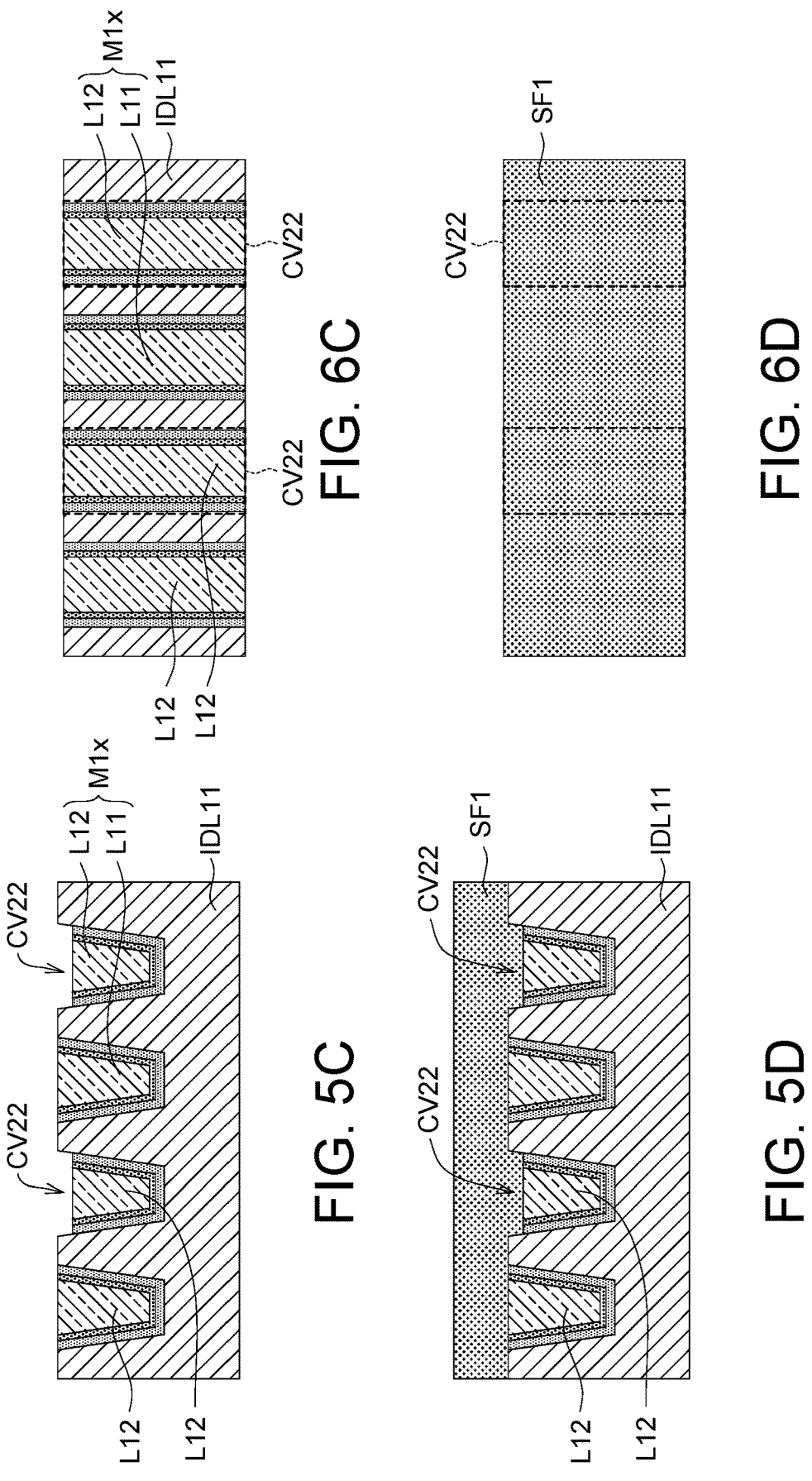

Then, as shown in the FIGS. 5C and 6C, second concaves CV22 are formed on some of the second conductive lines L12.

Next, as shown in the FIGS. 5D and 6D, the sacrificial material SF1 is formed in the second concaves CV22 and on the first dielectric layer IDL11.

Figure 6E:
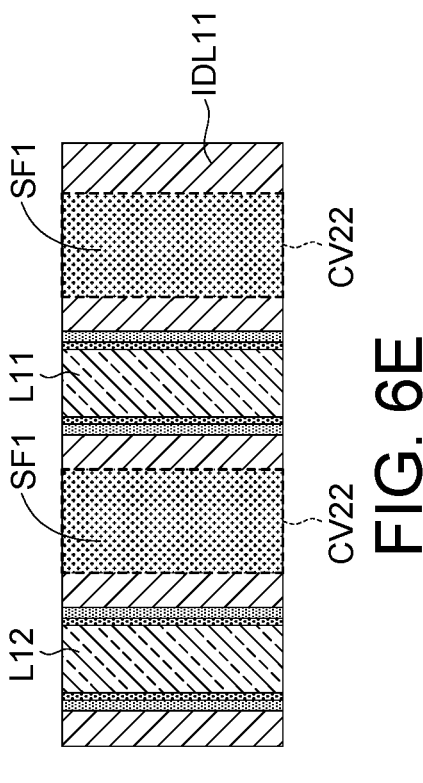
Figure 5E:
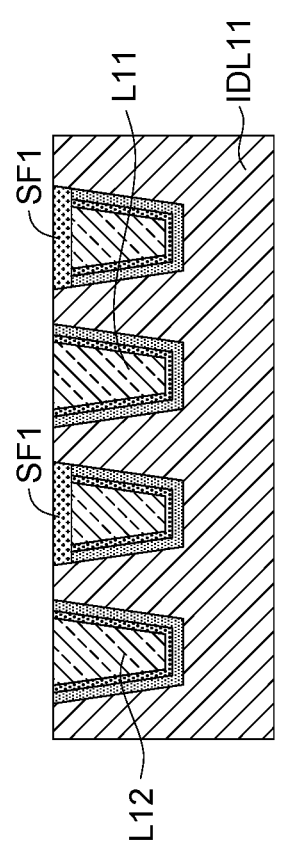

Afterwards, as shown in the FIGS. 5E and 6E, the sacrificial material SF1 is thinned down to expose the first dielectric layer IDL11, the first conductive line L11 and some of the second conductive lines L12.

Figure 6F:
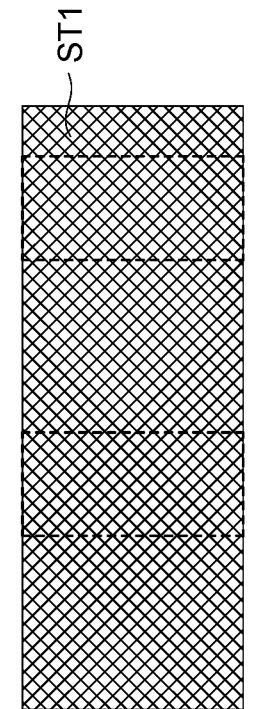
Figure 6F:
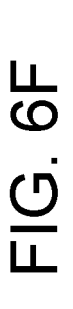
Figure 5F:
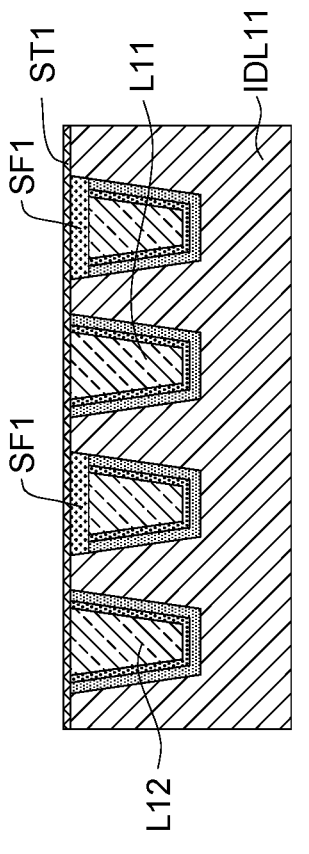

Then, as shown in the FIGS. 5F and 6F, the sustaining layer ST1 is formed on the sacrificial material SF1, the first dielectric layer IDL11, the first conductive line L11 and some of the second conductive line L12.

Figure 6G:
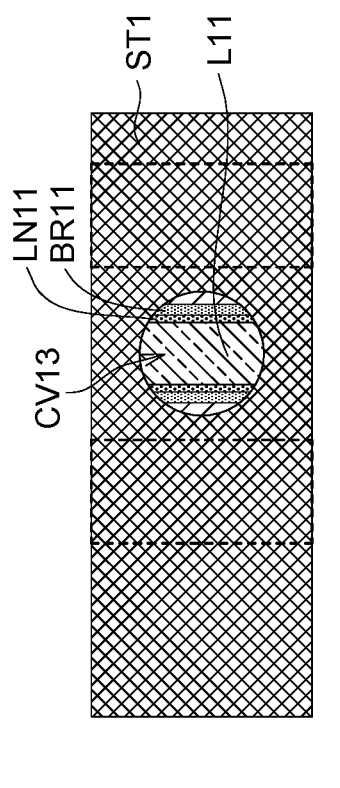
Figure 5G:
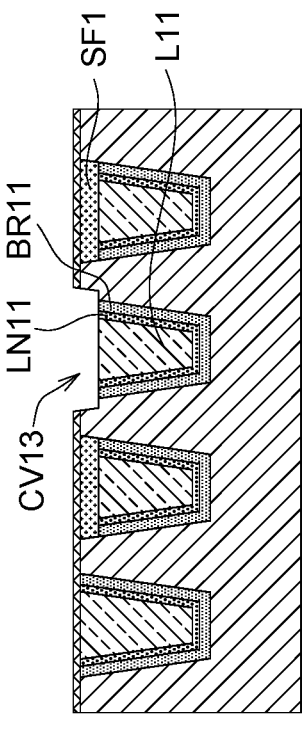

Next, as shown in the FIGS. 5G and 6G, the third concave CV13 is formed to expose the first conductive line L11. The third concave CV13 may also expose the first liner layer LN11 and the first barrier layer BR11.

Figure 6H:
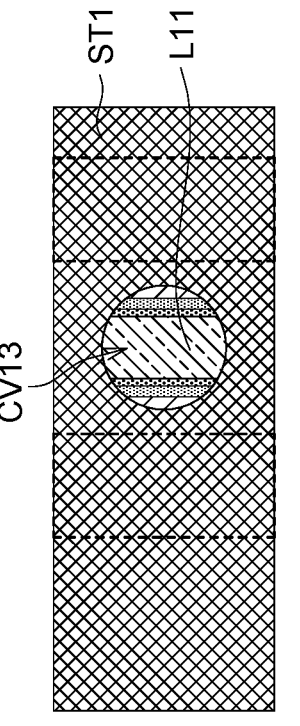
Figure 5H:
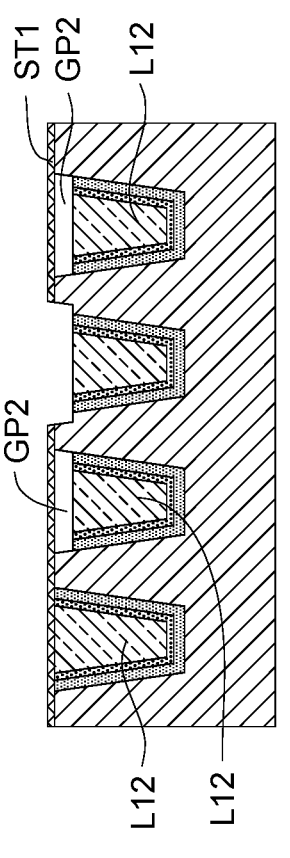

Then, as shown in the FIGS. 5H and 6H, the sacrificial material SF1 is removed to form the air gaps GP2 disposed between the sustaining layer ST1 and some of the second conductive lines L12.

Figures 5I, 5J, 6I, 6J:
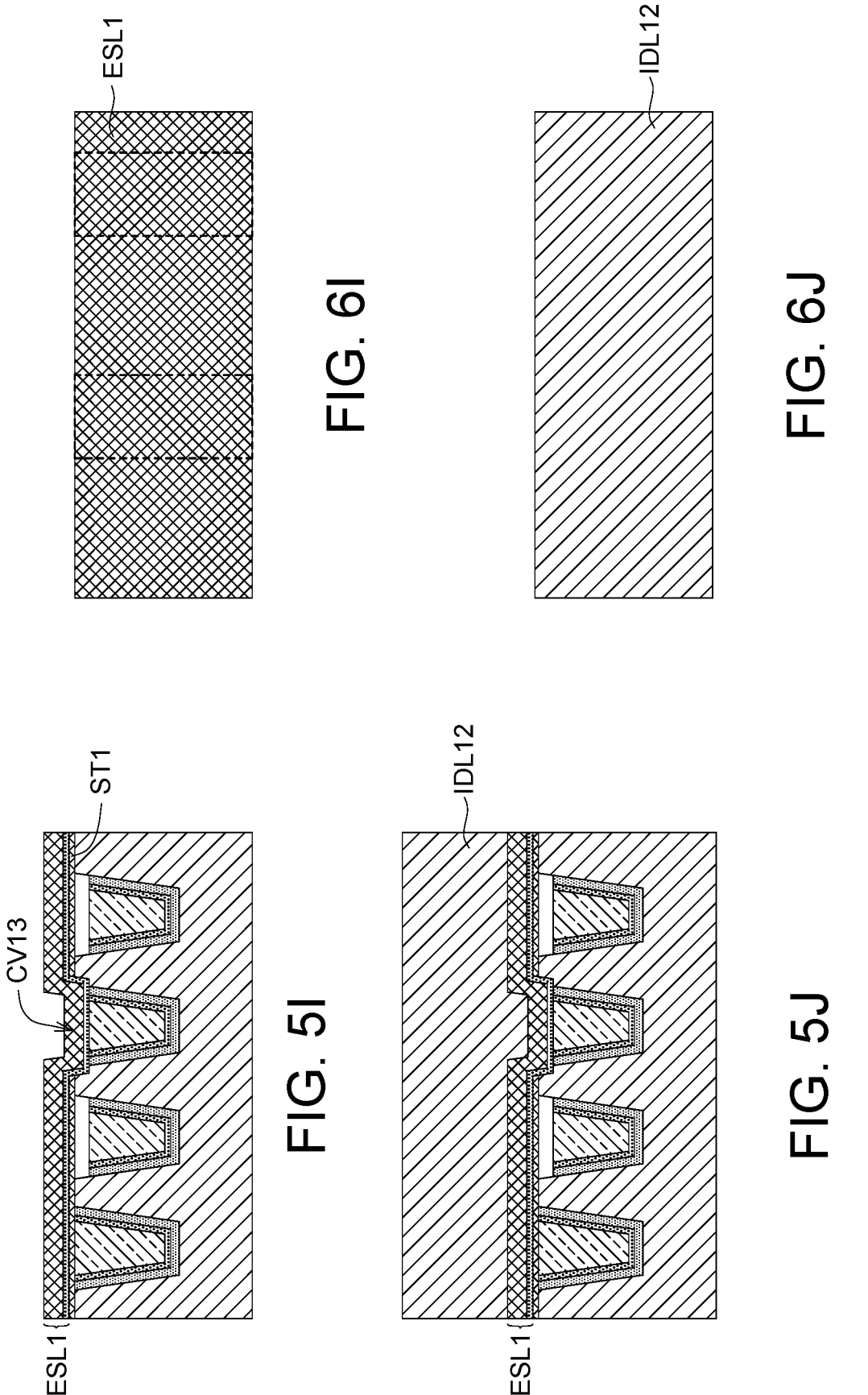

Next, as shown in the FIGS. 5I and 6I, the etching stop layer ESL1 is formed on the sustaining layer ST1 and in the third concave CV13.

Afterwards, as shown in the FIGS. 5J and 6J, the second dielectric layer IDL12 is formed on the etching stop layer ESL1.

Figure 6K:
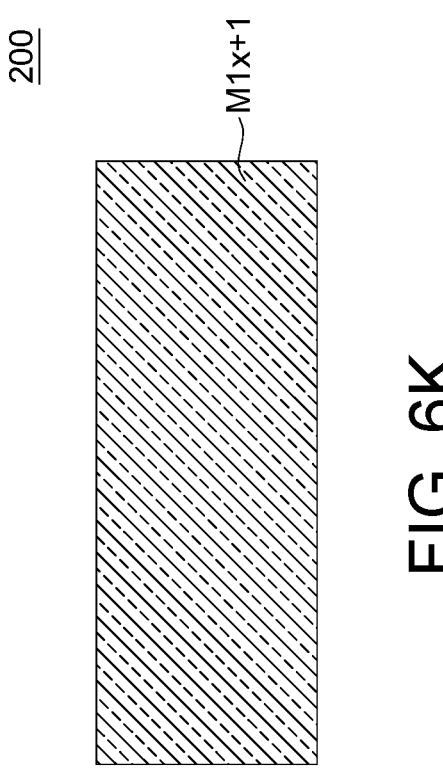
Figure 5K:
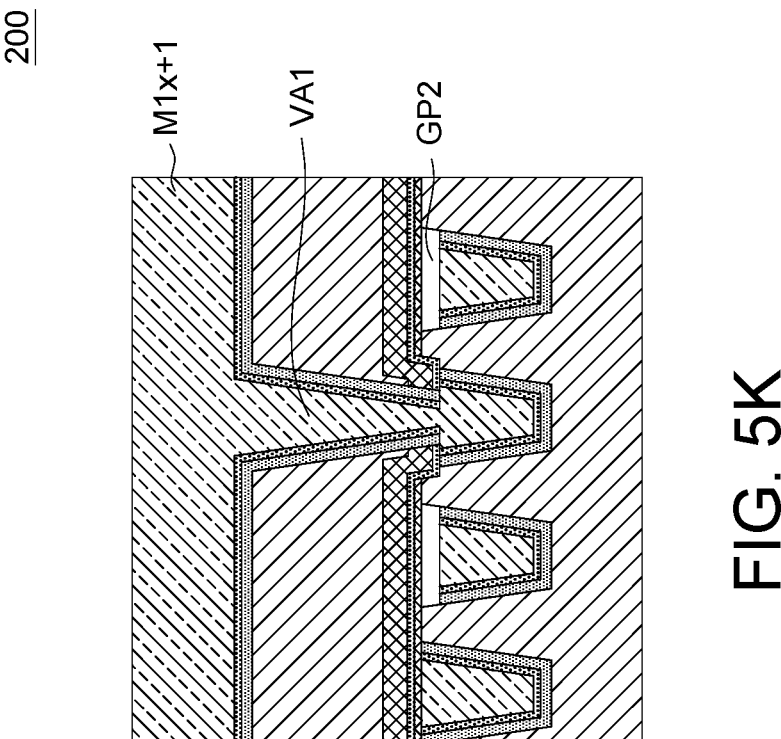

Next, as shown in the FIGS. 5K and 6K, the via VA1 and the second metal layer M1x+1 are formed.

Figure 4:
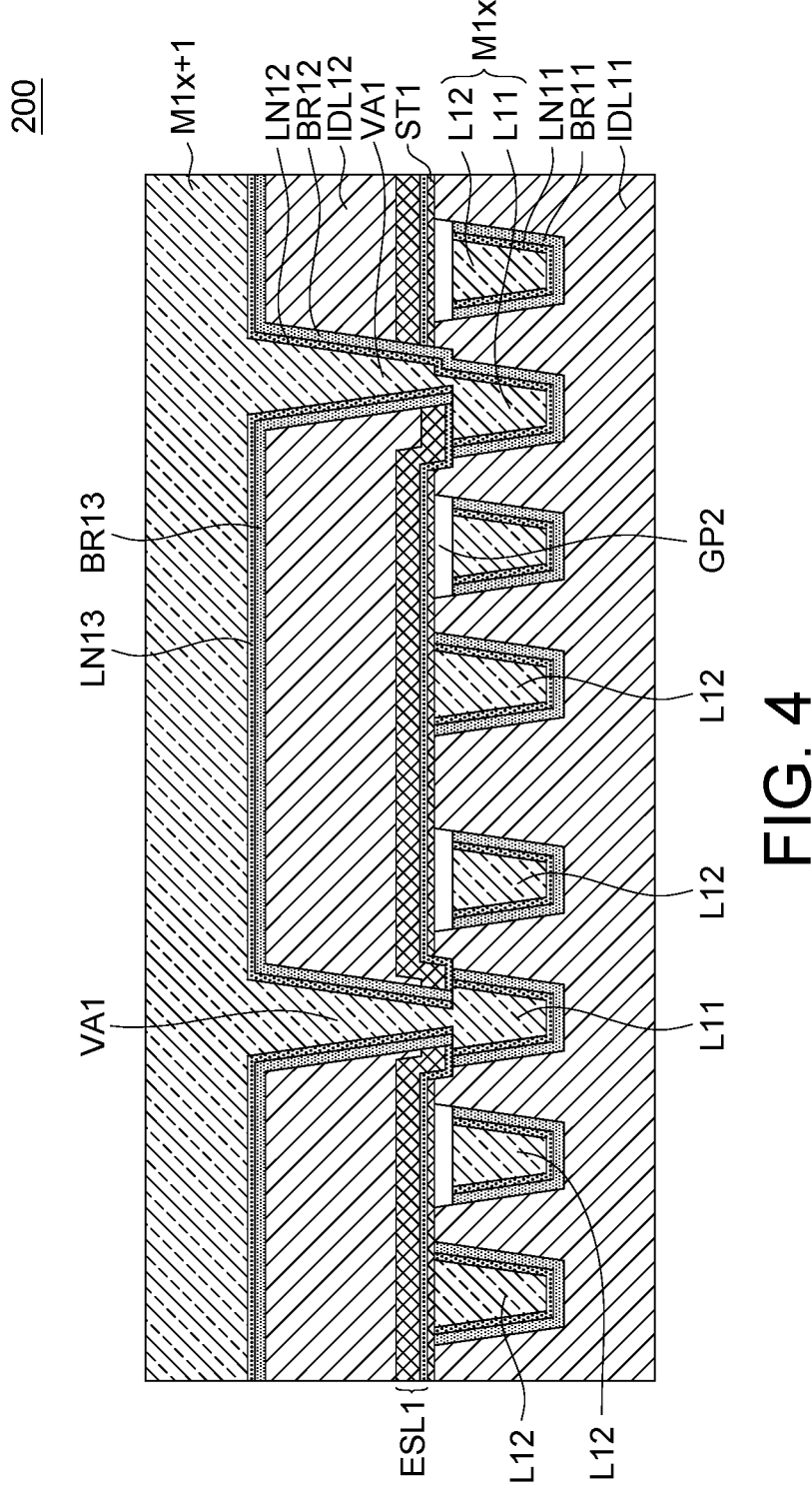
FIG. 4 shows a semiconductor structure 200 according to another embodiment.

As shown in the FIG. 4, the air gaps GP2 are formed on some of the second conductive lines L12 which are adjacent to the via VA1, so that the via VA1 would be self-aligned on the first conductive line L11. Even if the via VA1 is shifted to the right, the via VA1 and the second conductive line L12 are separated at a sufficient distance, as such the time dependent dielectric breakdown (TDDB) window is improved. Moreover, the air gaps GP2 provide a low-capacitance region for capacitance reduction and performance boost.

In addition to the above embodiment, another embodiment of the semiconductor structure may be adopted. Please refer to FIG. 7, which shows a semiconductor structure 300 according to another embodiment. In the FIG. 7, the air gap GP3 is formed by etching the first conductive line L11 and the second conductive line L12 without etching the first barrier layer BR21 and the first liner layer LN21.

Please refer to FIGS. 8A to 8K and FIGS. 9A to 9K. The FIGS. 8A to 8K illustrate a manufacturing method of the semiconductor structure 300 according to one embodiment. The FIGS. 9A to 9K respectively show top views of the FIGS. 8A to 8K. As shown in the FIGS. 8A and 8A, the first dielectric layer IDL11 is formed.

Figures 8A, 8B, 9A, 9B:
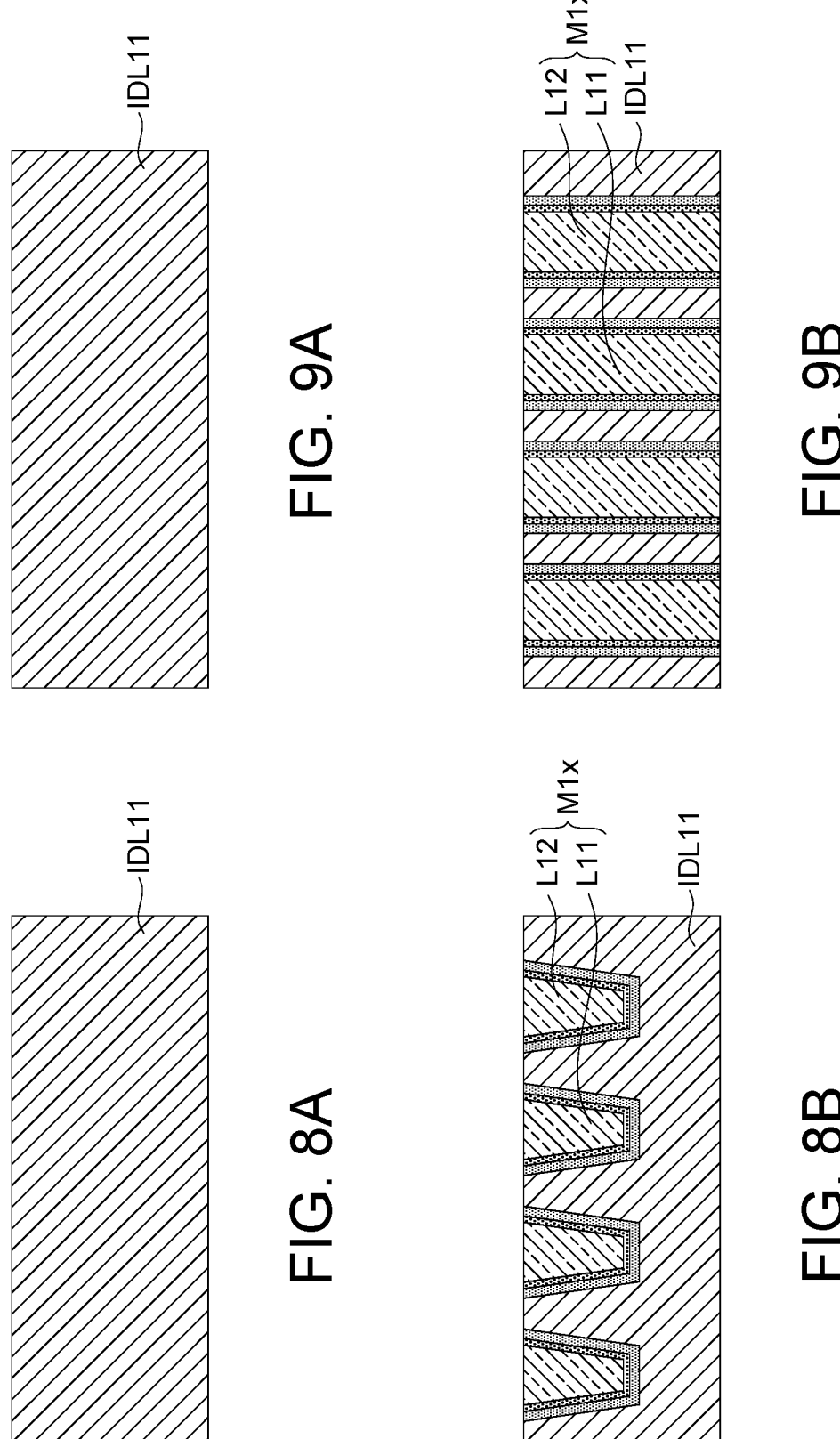
FIGS. 8A to 8K illustrate a manufacturing method of the semiconductor structure 300 according to one embodiment.
FIGS. 9A to 9K respectively show top views of the FIGS. 8A to 8K.

Afterwards, as shown in the FIGS. 8B and 9B, the first metal layer M1x embodied in the first dielectric layer IDL11 is formed.

Figures 8C, 8D, 9C, 9D:
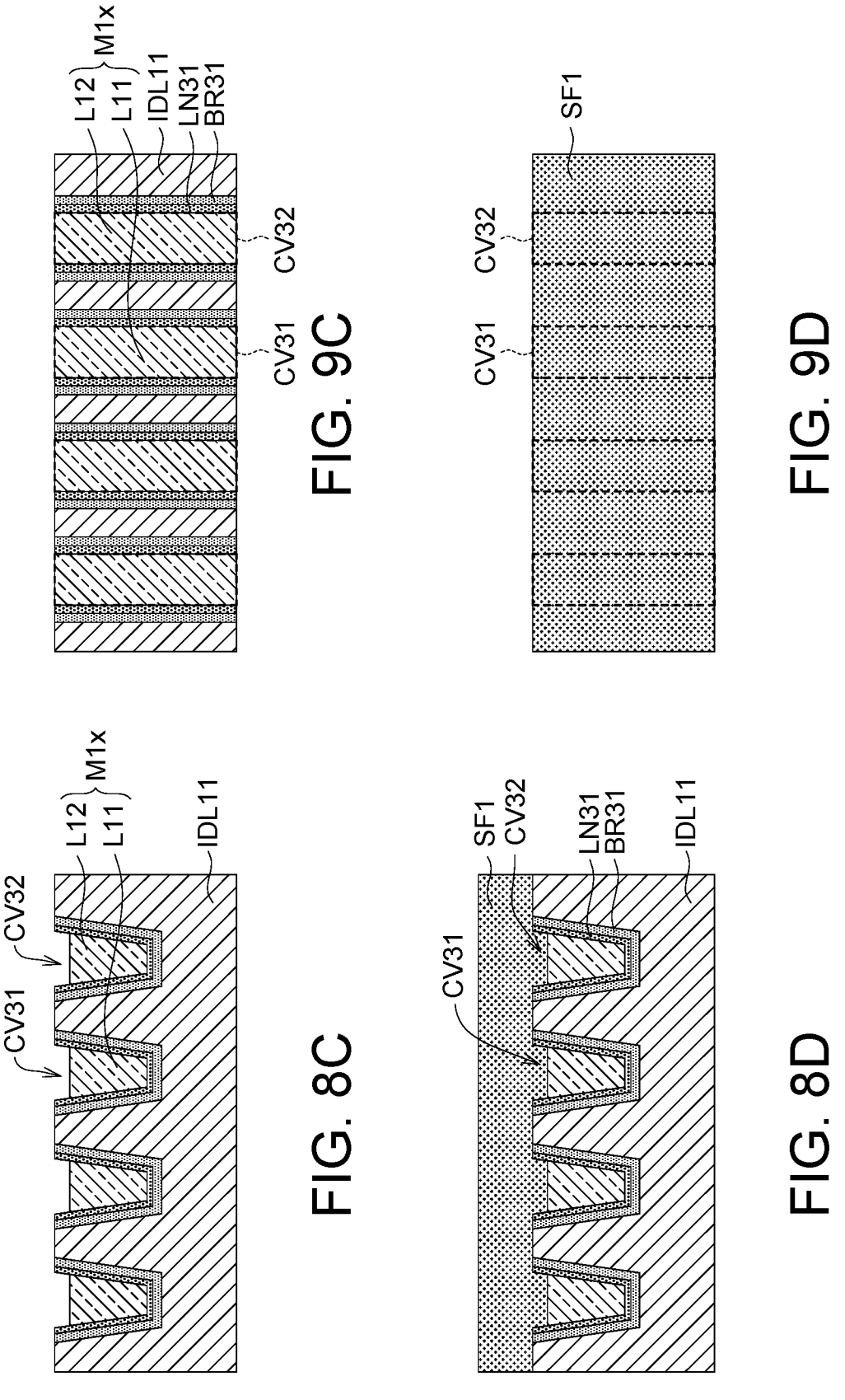

Then, as shown in the FIGS. 8C and 9C, a first concave CV31 and a second concave CV32 are formed on the first conductive line L11 and the second conductive lines L12 respectively. In this step, the first barrier layer BR31 and the first liner layer LN31 are not etched. The lateral walls of the first concave CV31 and the second concave CV32 expose the first liner layer LN31.

Next, as shown in the FIGS. 8D and 9D, the sacrificial material SF1 is formed in the first concave CV31 and the second concave CV32, and on the first dielectric layer IDL11. In this step, the sacrificial material SF1 contacts the first liner layer LN31 and the first barrier layer BR31.

Figures 8E, 8F, 9E, 9F:
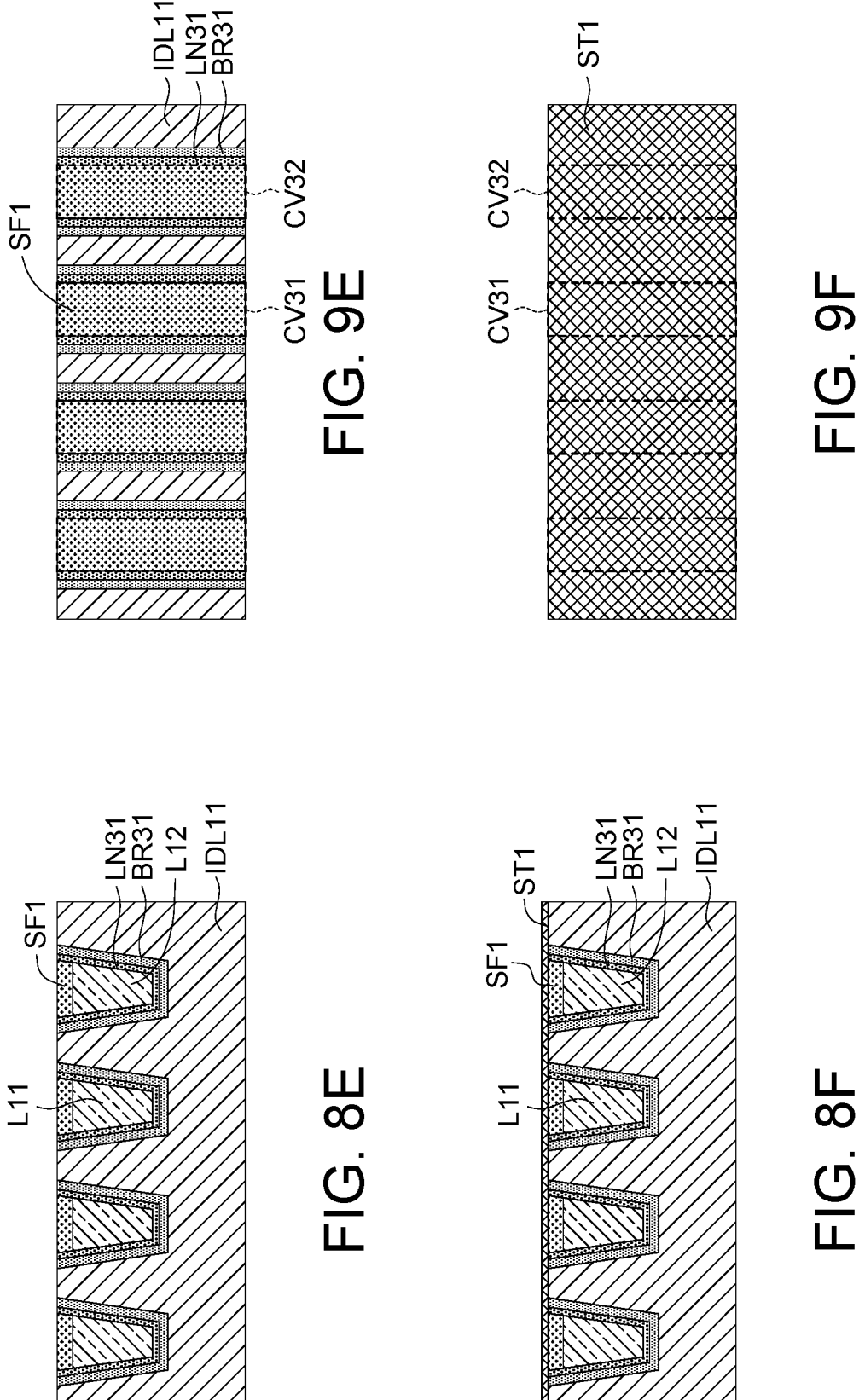

Afterwards, as shown in the FIGS. 8E and 9E, the sacrificial material SF1 is thinned down to expose the first dielectric layer IDL11, the first liner layer LN31 and the first barrier layer BR31.

Then, as shown in the FIGS. 8F and 9F, the sustaining layer ST1 is formed on the sacrificial material SF1, the first dielectric layer IDL11. In this step the sustaining layer ST1 may be also formed on the first liner layer LN31 and the first barrier layer BR31.

Figures 8G, 8H, 9G, 9H:
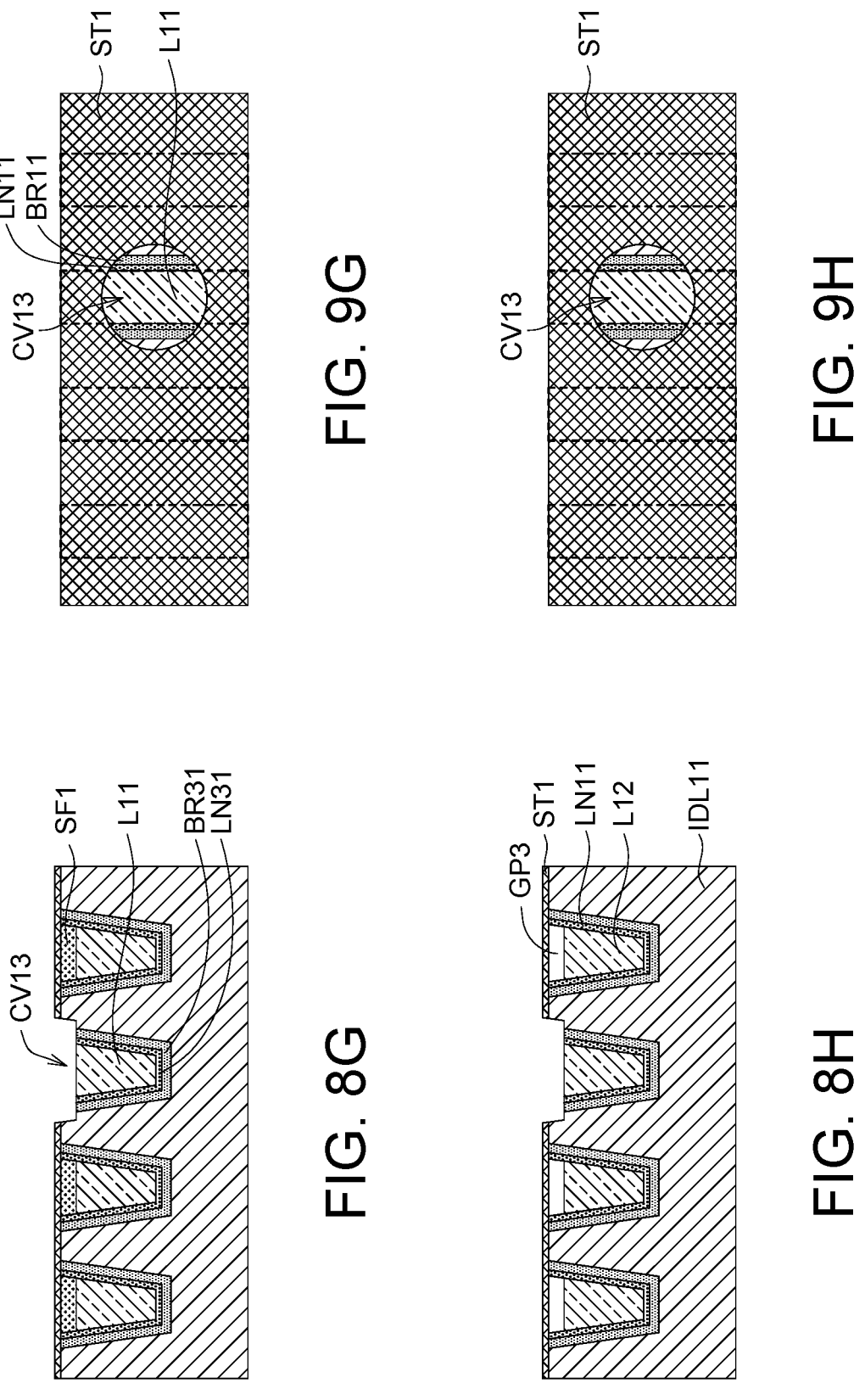

Next, as shown in the FIGS. 8G and 9G, the third concave CV13 is formed to expose the first conductive line L11. The third concave CV13 may also expose the first liner layer LN31 and the first barrier layer BR31.

Then, as shown in the FIGS. 8H and 9H, the sacrificial material SF1 is removed to form the air gap GP3 disposed between the sustaining layer ST1 and the second conductive line L12. The air gap GP3 may be encircled by the sustaining layer ST1, the second conductive line L12 and the first liner layer LN11.

Figures 8I, 8J, 9I, 9J:
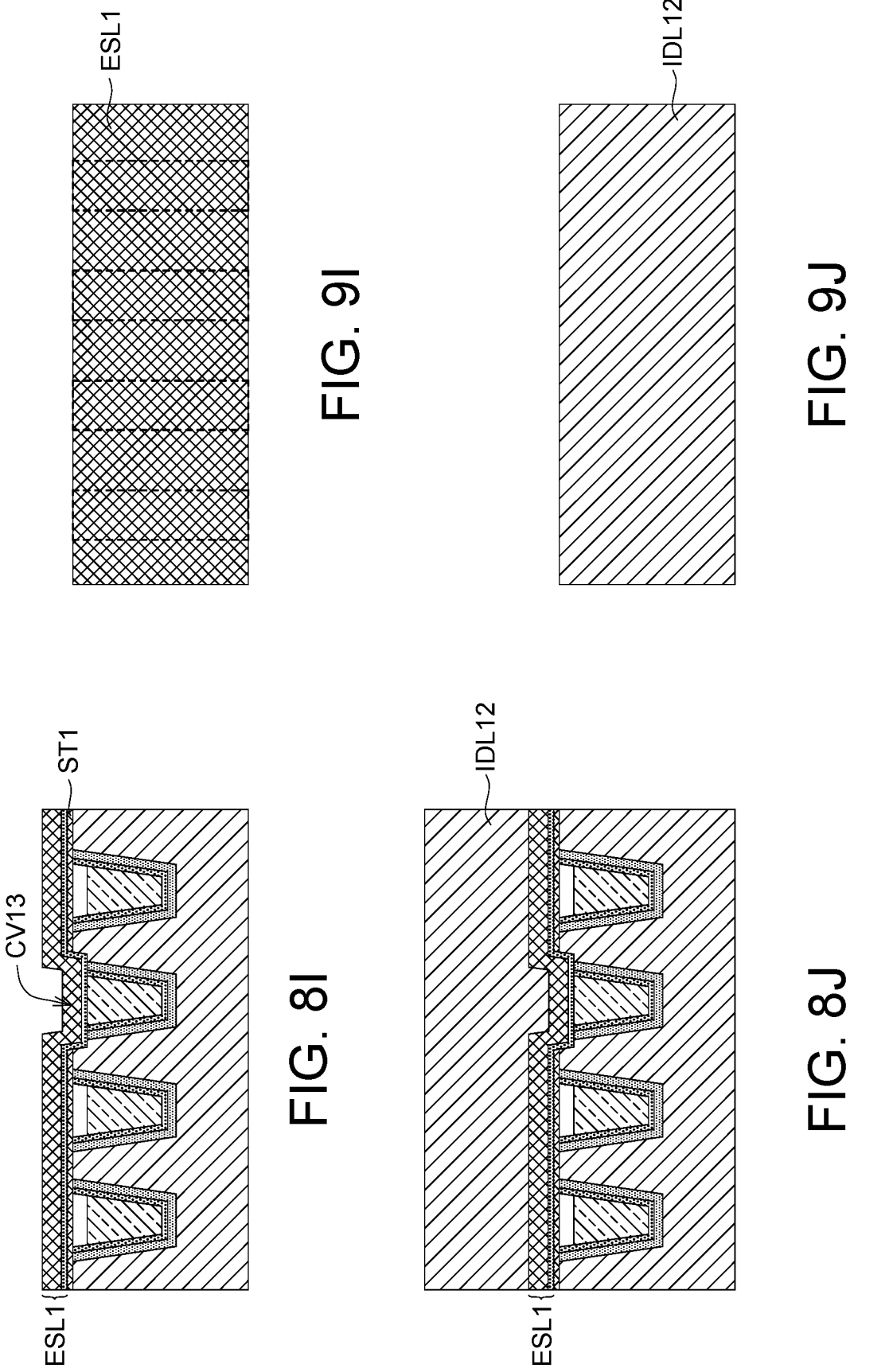

Next, as shown in the FIGS. 8I and 9I, the etching stop layer ESL1 is formed on the sustaining layer ST1 and in the third concave CV13.

Afterwards, as shown in the FIGS. 8J and 9J, the second dielectric layer IDL2 is formed on the etching stop layer ESL1.

Figure 9K:
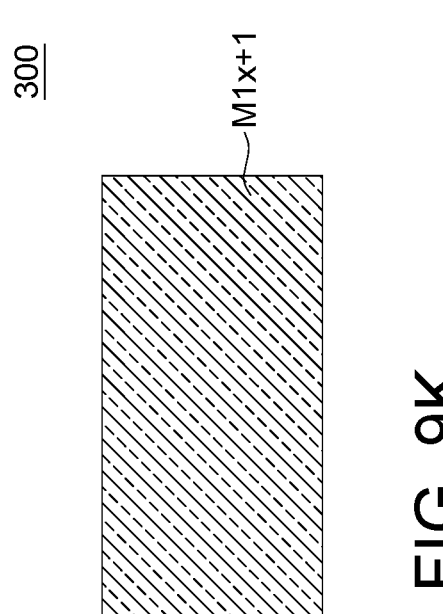
Figure 8K:
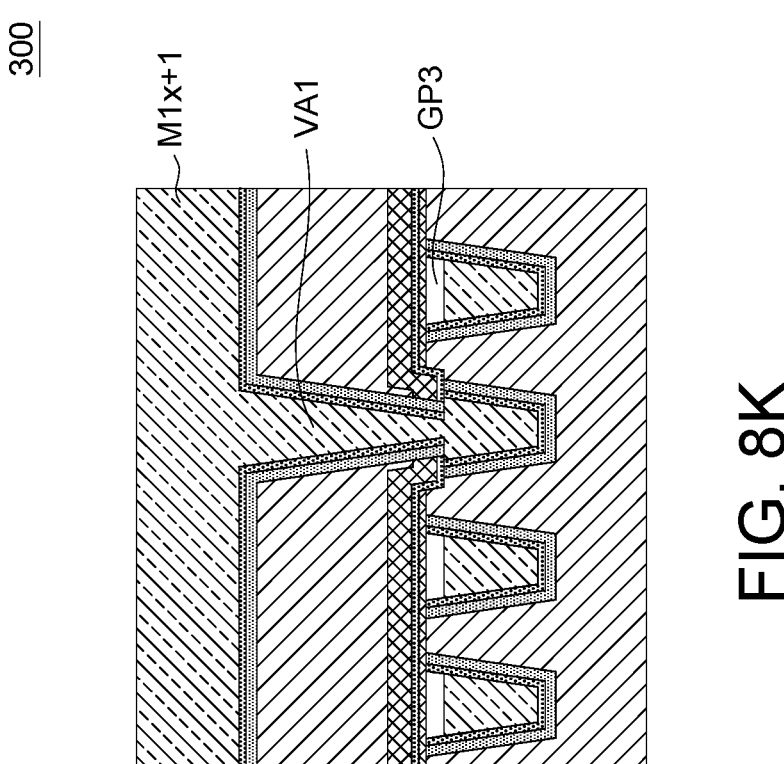

Next, as shown in the FIGS. 8K and 9K, the via VA1 and the second metal layer M1x+1 are formed.

Figure 7:
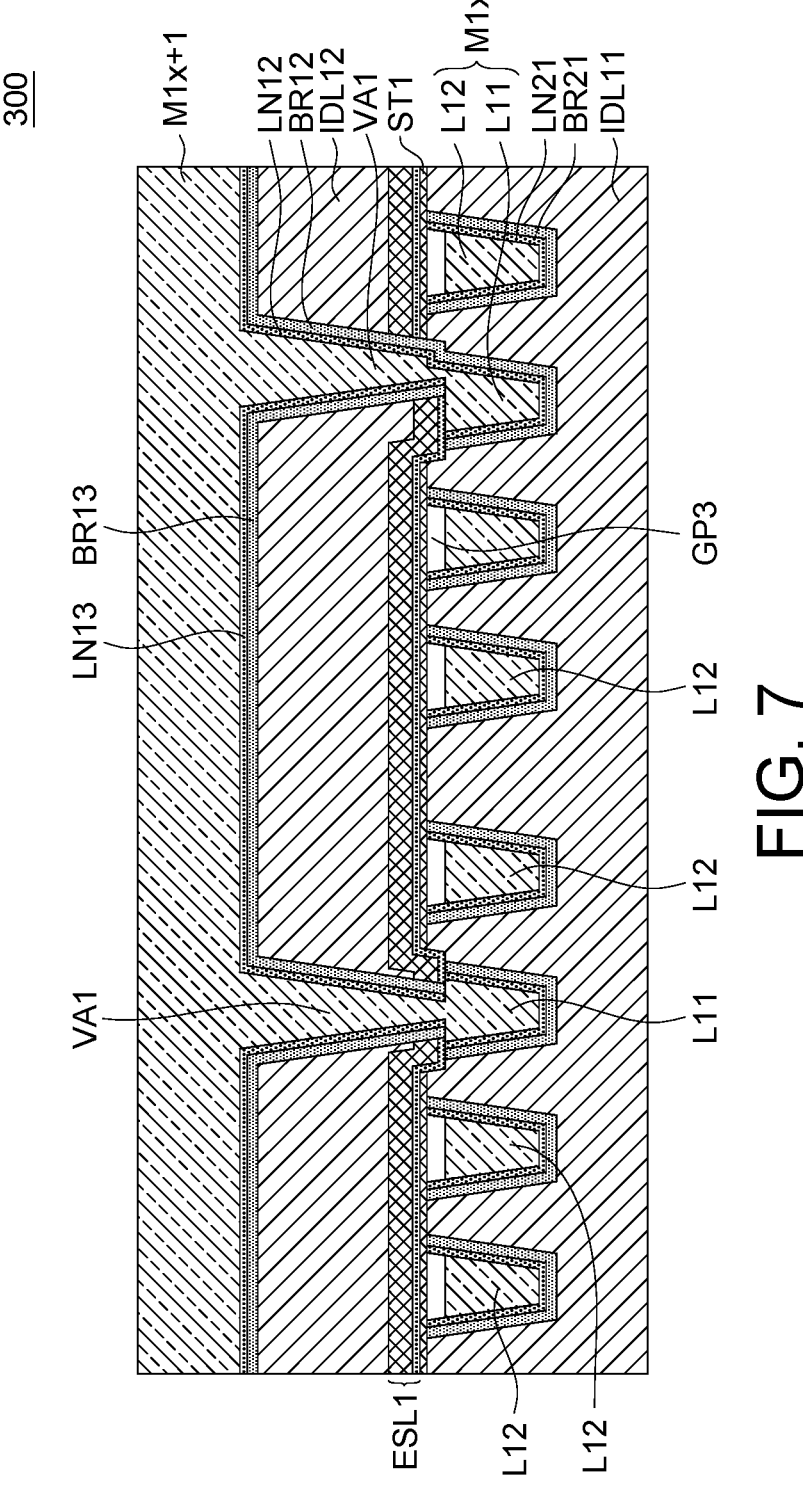
FIG. 7 shows a semiconductor structure 300 according to another embodiment.

As shown in the FIG. 7, the second conductive lines L12 is exposed by the air gap GP3. Even if the via VA1 is shifted to the right, the via VA1 and the second conductive line L12 are separated at a sufficient distance, as such the time dependent dielectric breakdown (TDDB) window is improved. Moreover, the air gaps GP3 provide a low-capacitance region for capacitance reduction and performance boost.

According to the disclosure, several embodiments are provided. The example embodiments are not used to limit the present disclosure. The example embodiments may include the following examples.

Example Embodiment A: A semiconductor structure is provided. The semiconductor structure includes a first dielectric layer, a first metal layer, a via, an air gap, an etching stop layer, a second dielectric layer, and a second metal layer. The first metal layer is embedded in the first dielectric layer. The first metal layer includes a first conductive line and a second conductive line. The via is disposed on the first conductive line. The air gap is located on the second conductive line. The sustaining layer covers the air gap. The etching stop layer is disposed on the sustaining layer. The second dielectric layer is disposed on the etching stop layer. The second metal layer is disposed on the second dielectric layer and connected to the via.

Example Embodiment based on the Example Embodiment A: A height of the air gap is 50 to 200 Å.

Example Embodiment based on the Example Embodiment A: A top surface of the second conductive line is fully exposed by the air gap.

Example Embodiment based on the Example Embodiment A: A top surface of the first dielectric layer is higher than a top surface of the second conductive layer.

Example Embodiment based on the Example Embodiment A: A thickness of the sustaining layer is 10 to 50 Å.

Example Embodiment based on the Example Embodiment A: The sustaining layer covers the first dielectric layer.

Example Embodiment based on the Example Embodiment A: A material of the sustaining layer is silicon carbon nitride (SiCxNy), boron nitride (BN), boron carbonitride (BCN), silicon oxycarbonitride (SiOCN), silicon oxycarbide (SiOC) or a combination thereof.

Example Embodiment based on the Example Embodiment A: A bottom of the via is lower than a top of the air gap.

Example Embodiment B: A semiconductor structure is provided. The semiconductor includes a first dielectric layer, a first metal layer, a via, a sustaining layer, an etching stop layer, a second dielectric layer and a second metal layer. The first metal layer is embedded in the first dielectric layer. The first metal layer includes a first conductive line and a second conductive line. A top surface of the second conductive line is exposed by air. The via is disposed on the first conductive line. The sustaining layer is covered by the first dielectric layer. The etching stop layer is disposed on the sustaining layer. The second dielectric layer is disposed on the etching stop layer. The second metal layer is disposed on the second dielectric layer and connected to the via.

Example Embodiment based on the Example Embodiment B: A distance between the second conductive line and the sustaining layer is 50 to 200 Å.

Example Embodiment based on the Example Embodiment B: The top surface of the second conductive line is fully exposed by air.

Example Embodiment based on the Example Embodiment B: A top surface of the first dielectric layer is higher than the top surface of the second conductive layer.

Example Embodiment based on the Example Embodiment B: A thickness of the sustaining layer is 10 to 50 Å.

Example Embodiment based on the Example Embodiment B: The sustaining layer covers the first dielectric layer.

Example Embodiment based on the Example Embodiment B: A material of the sustaining layer is silicon carbon nitride (SiCxNy), boron nitride (BN), boron carbonitride (BCN), silicon oxycarbonitride (SiOCN), silicon oxycarbide (SiOC) or a combination thereof.

Example Embodiment based on the Example Embodiment B: A bottom of the via is lower than a bottom surface of the sustaining layer.

Example Embodiment C: A manufacturing method of a semiconductor structure is provided. The manufacturing method of the semiconductor structure includes the following steps. forming a first dielectric layer; forming a first metal layer embodied in the first dielectric layer, wherein the first metal layer includes a first conductive line and a second conductive line; forming a first concave and a second concave on the first conductive line and the second conductive line respectively; forming a sacrificial material in the first concave, the second concave and on the first dielectric layer; thinning down the sacrificial material to expose the first dielectric layer; forming a sustaining layer on the sacrificial material and the first dielectric layer; forming a third concave to expose the first conductive line; removing the sacrificial material to form an air gap disposed between the sustaining layer and the second conductive line; forming an etching stop layer on the sustaining layer and in the third concave; forming a second dielectric layer on the etching stop layer; and forming a via and a second metal layer, wherein the via is embedded in the second dielectric layer and connects the first conductive line, and the second metal layer is formed on the second dielectric layer to connect the via.

Example Embodiment based on the Example Embodiment C: A width of the third concave is larger than a width of the second concave.

Example Embodiment based on the Example Embodiment C: in the thinning down the sacrificial material, the sacrificial material is thinned down by chemical mechanical polish (CMP) process or etching process.

Example Embodiment based on the Example Embodiment C: in the removing the sacrificial material, the sacrificial material is removed by a thermal process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor structure, comprising:

forming a first dielectric layer;

forming a first metal layer embodied in the first dielectric layer, wherein the first metal layer includes a first conductive line and a second conductive line;

forming a first concave and a second concave on the first conductive line and the second conductive line respectively;

forming a sacrificial material in the first concave, the second concave and on the first dielectric layer;

thinning down the sacrificial material to expose the first dielectric layer;

forming a sustaining layer on the sacrificial material and the first dielectric layer;

forming a third concave to expose the first conductive line;

removing the sacrificial material to form an air gap disposed between the sustaining layer and the second conductive line;

forming an etching stop layer on the sustaining layer and in the third concave;

forming a second dielectric layer on the etching stop layer; and forming a via and a second metal layer, wherein the via is embedded in the second dielectric layer and connects the first conductive line, and the second metal layer is formed on the second dielectric layer to connect the via.

2. The manufacturing method of the semiconductor structure according to claim 1, wherein a width of the third concave is larger than a width of the second concave.

3. The manufacturing method of the semiconductor structure according to claim 1, wherein in the thinning down the sacrificial material, the sacrificial material is thinned down by chemical mechanical polish (CMP) process or etching process.

4. The manufacturing method of the semiconductor structure according to claim 1, wherein in the removing the sacrificial material, the sacrificial material is removed by a thermal process.

5. The manufacturing method of the semiconductor structure according to claim 1, wherein in the removing the sacrificial material, the sacrificial material is removed by UV, flash lamp or laser.

6. The manufacturing method of the semiconductor structure according to claim 1, wherein in the step of forming the first concave and the second concave, lateral walls of the first concave and the second concave expose the first dielectric layer.

7. The manufacturing method of the semiconductor structure according to claim 1, wherein in the step of forming the first concave and the second concave, a first barrier layer and a first liner layer are etched.

8. The manufacturing method of the semiconductor structure according to claim 1, wherein in the step of forming the third concave, the third concave expose a first liner layer and a first barrier layer.

9. A manufacturing method of a semiconductor structure, comprising: forming a first dielectric layer; forming a first metal layer embodied in the first dielectric layer, wherein the first metal layer includes a first conductive line and two second conductive lines; forming a first concave on one of the two second conductive lines; forming a second concave on the other one of the two second conductive lines; forming a sacrificial material in the second concave in the first concave, the second concave and on the first dielectric layer; thinning down the sacrificial material to expose the first dielectric layer; forming a sustaining layer on the sacrificial material and the first dielectric layer; forming a third concave to expose the first conductive line; removing the sacrificial material to form an air gap disposed between the sustaining layer and one of the second conductive lines; forming an etching stop layer on the sustaining layer and in the third concave; forming a second dielectric layer on the etching stop layer; and forming a via and a second metal layer, wherein the via is embedded in the second dielectric layer and connects the first conductive line, and the second metal layer is formed on the second dielectric layer to connect the via.

10. The manufacturing method of the semiconductor structure according to claim 9, wherein a width of the third concave is larger than a width of the second concave.

11. The manufacturing method of the semiconductor structure according to claim 9, wherein in the thinning down the sacrificial material, the sacrificial material is thinned down by chemical mechanical polish (CMP) process or etching process.

12. The manufacturing method of the semiconductor structure according to claim 9, wherein in the removing the sacrificial material, the sacrificial material is removed by a thermal process.

13. The manufacturing method of the semiconductor structure according to claim 9, wherein in the step of forming the first concave and the second concave, lateral walls of the first concave and the second concave expose the first dielectric layer.

14. The manufacturing method of the semiconductor structure according to claim 9, wherein in the step of forming the first concave and the second concave, a first barrier layer and a first liner layer are etched.

15. The manufacturing method of the semiconductor structure according to claim 9, wherein in the step of forming the third concave, the third concave expose a first liner layer and a first barrier layer.

16. A manufacturing method of a semiconductor structure, comprising:

forming a first dielectric layer;

forming a first metal layer embodied in the first dielectric layer, wherein the first metal layer includes a first conductive line and a second conductive line;

forming a first concave and a second concave on the first conductive line and the second conductive line respectively, wherein lateral walls of the first concave and the second concave expose a first liner layer;

forming a sacrificial material in the first concave, the second concave and on the first dielectric layer;

thinning down the sacrificial material to expose the first dielectric layer;

forming a sustaining layer on the sacrificial material and the first dielectric layer;

forming a third concave to expose the first conductive line;

removing the sacrificial material to form an air gap disposed between the sustaining layer and the second conductive line;

forming an etching stop layer on the sustaining layer and in the third concave;

forming a second dielectric layer on the etching stop layer; and forming a via and a second metal layer, wherein the via is embedded in the second dielectric layer and connects the first conductive line, and the second metal layer is formed on the second dielectric layer to connect the via.

17. The manufacturing method of the semiconductor structure according to claim 16, wherein a width of the third concave is larger than a width of the second concave.

18. The manufacturing method of the semiconductor structure according to claim 16, wherein in the thinning down the sacrificial material, the sacrificial material is thinned down by chemical mechanical polish (CMP) process or etching process.

19. The manufacturing method of the semiconductor structure according to claim 16, wherein in the removing the sacrificial material, the sacrificial material is removed by a thermal process.

20. The manufacturing method of the semiconductor structure according to claim 16, wherein in the step of forming the third concave, the third concave expose the first liner layer and a first barrier layer.

* * * * *